US012672378B2

(12) United States Patent
　　Ohkubo

(10) Patent No.: US 12,672,378 B2
(45) Date of Patent: Jun. 30, 2026

(54) IMAGING DEVICE, ELECTRONIC DEVICE, AND MANUFACTURING METHOD

(71) Applicant: SONY SEMICONDUCTOR SOLUTIONS CORPORATION, Kanagawa (JP)

(72) Inventor: Tomohiro Ohkubo, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 547 days.

(21) Appl. No.: 18/254,425

(22) PCT Filed: Nov. 19, 2021

(86) PCT No.: PCT/JP2021/042527
　　§ 371 (c)(1),
　　(2) Date: May 25, 2023

(87) PCT Pub. No.: WO2022/118670
　　PCT Pub. Date: Jun. 9, 2022

(65) Prior Publication Data
　　US 2024/0006450 A1　　Jan. 4, 2024

(30) Foreign Application Priority Data

Dec. 4, 2020　(JP) ................................. 2020-201544

(51) Int. Cl.
　　*H10F 39/00*　　　(2025.01)
(52) U.S. Cl.
　　CPC ......... *H10F 39/809* (2025.01); *H10F 39/018* (2025.01); *H10F 39/026* (2025.01); *H10F 39/811* (2025.01)
(58) Field of Classification Search
　　CPC .................................................. H10F 39/026
　　See application file for complete search history.

(56) References Cited

U.S. PATENT DOCUMENTS

2010/0210088 A1* 8/2010 Ishimaru ............... H10F 39/026
　　　　　　　　　　　　　　　　　438/459
2014/0210029 A1* 7/2014 Cheng ................. H10F 39/8053
　　　　　　　　　　　　　　　　　438/70
(Continued)

FOREIGN PATENT DOCUMENTS

JP　　2012-178496 A　　9/2012
JP　　2013-089871 A　　5/2013
(Continued)

OTHER PUBLICATIONS

International Search Report and Written Opinion of PCT Application No. PCT/JP2021/042527, issued on Feb. 8, 2022, 11 pages of ISRWO.

*Primary Examiner* — Benjamin P Sandvik
(74) *Attorney, Agent, or Firm* — CHIP LAW GROUP

(57) ABSTRACT

The present technology relates to an imaging device, an electronic device, and a manufacturing method capable of evaluating a chip at a desired timing.

The imaging device includes: a first semiconductor chip; and a second semiconductor chip stacked on the first semiconductor chip, in which at least one surface of side surfaces of the first semiconductor chip and at least one surface of side surfaces of the second semiconductor chip are on the same plane. The first semiconductor chip includes a first structure having a ring-shape, and the second semiconductor chip is disposed at a position straddling the first structure on the first semiconductor chip. The present technology can be applied to, for example, an imaging device in which a plurality of semiconductor chips is stacked.

15 Claims, 40 Drawing Sheets

(56)          References Cited

U.S. PATENT DOCUMENTS

| | | | |
|---|---|---|---|
| 2014/0334601 A1* | 11/2014 | Shizukuishi | ........ H10F 39/1895 |
| | | | 378/62 |
| 2018/0040658 A1* | 2/2018 | Kang | .................... H10F 39/804 |
| 2019/0157333 A1* | 5/2019 | Tsai | ........................ H01L 24/06 |
| 2022/0328549 A1* | 10/2022 | Nitta | .................... H10F 39/809 |
| 2022/0359601 A1* | 11/2022 | Tsai | ..................... H10F 39/018 |
| 2023/0103730 A1* | 4/2023 | Kaneguchi | ........... H10F 39/811 |
| | | | 257/291 |

FOREIGN PATENT DOCUMENTS

| | | |
|---|---|---|
| JP | 2014-099582 A | 5/2014 |
| JP | 2016-163011 A | 9/2016 |
| WO | 2016/143553 A1 | 9/2016 |
| WO | 2019/087764 A1 | 5/2019 |

* cited by examiner

SUPPORT SUBSTRATE

IMAGING ELEMENT

SUPPORT SUBSTRATE

IMAGING ELEMENT 252
251
351
311
221c
352
71c
242
241
220c
232
231
261c

SUPPORT SUBSTRATE

IMAGING ELEMENT 252
251
71e
411
412
400
242
71c
351
311
221c
352
220c
232
231
241
416
415
261e
413
414

SUPPORT SUBSTRATE

IMAGING ELEMENT

IMAGING DEVICE, ELECTRONIC DEVICE, AND MANUFACTURING METHOD

CROSS REFERENCE TO RELATED APPLICATIONS

This application is a U.S. National Phase of International Patent Application No. PCT/JP2021/042527 filed on Nov. 19, 2021, which claims priority benefit of Japanese Patent Application No. JP 2020-201544 filed in the Japan Patent Office on Dec. 4, 2020. Each of the above-referenced applications is hereby incorporated herein by reference in its entirety.

TECHNICAL FIELD

The present technology relates to an imaging device, an electronic device, and a manufacturing method, and for example, relates to an imaging device, an electronic device, and a manufacturing method suitable for application to an imaging device including a plurality of chips.

BACKGROUND ART

Conventionally, a solid-state imaging element such as a charge coupled device (CCD)/complementary metal oxide semiconductor (CMOS) image sensor is used, for example, in an electronic device having an imaging function such as a digital still camera and a digital video camera. Furthermore, in recent years, downsizing and high functionality of solid-state imaging elements have been promoted, and stacked CMOS image sensors have been widely adopted.

For example, as a technique for downsizing the configuration of an imaging device, a technique has been proposed in which a solid-state imaging element is stacked with circuits such as a signal processing circuit and a memory circuit by wafer on wafer (WoW) that performs bonding of the circuits in a wafer state (for example, see Patent Document 1).

CITATION LIST

Patent Document

Patent Document 1: Japanese Patent Application Laid-Open No. 2014-099582

SUMMARY OF THE INVENTION

Problems to be Solved by the Invention

However, in the case of WoW, there is no problem as long as chips of wafers to be stacked have the same size, but the size has to be adjusted to the largest chip size when the sizes of individual chips made to be the wafer are different, and there has been a possibility that manufacturing efficiency of each circuit is deteriorated and a cost is increased.

Therefore, chip on wafer (CoW) has been proposed in which a non-defective chip is picked up from a wafer and transferred onto another wafer. In CoW, the non-defective product is selected before the chip and the wafer are connected, and thus a test pattern for non-defective product selection is arranged in each of the chips and the wafers. The test pattern is arranged in a region to be diced, and is diced when chips are singulated from the wafer.

There is a demand for evaluating a test pattern on a chip side even after a chip is bonded onto a wafer by CoW, but such a demand cannot be met because the test pattern is diced before being stacked on the wafer.

The present technology has been made in view of such a situation, and enables evaluation by a test pattern even after bonding a chip to a wafer.

Solutions to Problems

An imaging device according to one aspect of the present technology is an imaging device including: a first semiconductor chip; and a second semiconductor chip stacked on the first semiconductor chip, in which at least one surface of side surfaces of the first semiconductor chip and at least one surface of side surfaces of the second semiconductor chip are on a same plane.

An electronic device according to one aspect of the present technology is an electronic device including: an imaging device including: a first semiconductor chip; and a second semiconductor chip stacked on the first semiconductor chip, at least one surface of side surfaces of the first semiconductor chip and at least one surface of side surfaces of the second semiconductor chip being on a same plane; and a processing unit that processes a signal from the imaging device.

A manufacturing method according to one aspect of the present technology is a manufacturing method including: transferring a second semiconductor chip to a wafer on which a first semiconductor chip is formed; and dicing the wafer in a state in which the second semiconductor chip is stacked, in which the second semiconductor chip in which a region for pellet check is formed is transferred to the wafer, and the region is also diced when diced with the wafer.

An imaging device according to one aspect of the present technology includes: a first semiconductor chip; and a second semiconductor chip stacked on the first semiconductor chip, in which at least one surface of side surfaces of the first semiconductor chip and at least one surface of side surfaces of the second semiconductor chip are on a same plane.

An electronic device according to one aspect of the present technology includes the imaging device.

In a manufacturing method according to one aspect of the present technology, a second semiconductor chip is transferred to a wafer on which a first semiconductor chip is formed, and dicing of the wafer is performed in a state where the second semiconductor chip is stacked. When the second semiconductor chip on which a region for pellet check is formed is transferred to the wafer and diced with the wafer, the region is also diced.

Note that the imaging device may be an independent device or an internal block constituting one device.

BRIEF DESCRIPTION OF DRAWINGS

FIG. 2 is a diagram for explaining a manufacturing process of an imaging device with CoW.

FIG. 4 is a diagram for explaining a manufacturing process of the imaging device with CoW.

FIG. 5 is a diagram for explaining a manufacturing process of the imaging device with CoW.

FIG. 6 is a diagram for explaining a manufacturing process of the imaging device with CoW.

FIG. 15 is a diagram for explaining a configuration of an imaging device in a second embodiment.

FIG. 18 is a diagram for explaining a configuration of an imaging device in a third embodiment.

FIG. 19 is a diagram for explaining a configuration of the imaging device in the third embodiment.

FIG. 24 is a diagram for explaining a configuration of an imaging device in a fifth embodiment.

FIG. 25 is a diagram for explaining a configuration of the imaging device in the fifth embodiment.

FIG. 26 is a diagram for explaining a configuration of the imaging device in the fifth embodiment.

FIG. 27 is a diagram for explaining a configuration of an imaging device in a sixth embodiment.

FIG. 28 is a diagram for explaining a configuration of the imaging device in the sixth embodiment.

FIG. 29 is a diagram for explaining a configuration of the imaging device in the sixth embodiment.

MODE FOR CARRYING OUT THE INVENTION

Modes for carrying out the present technology (hereinafter, referred to as embodiments) will be described below.

Manufacture of Imaging Device

A chip on wafer (CoW) technology applied when manufacturing an imaging device to which the present technology is applied will be described. CoW is a technique of picking up a non-defective chip of a logic substrate and bonding the non-defective chip to a sensor substrate.

Figure 1:
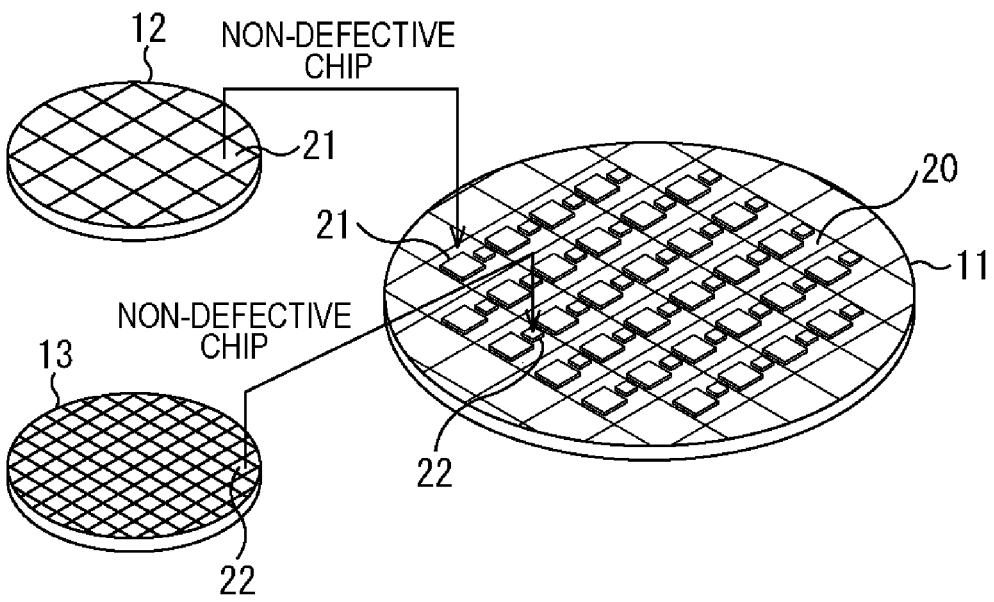
FIG. 1 is a diagram for explaining CoW.

FIG. 1 is a view for explaining a manufacturing method of an imaging device in which a logic circuit 21 and the memory circuit 22 that have been singulated into individual pieces and confirmed to be non-defective chips are directly formed in the imaging element 20 on a wafer 11.

In the wafer 11, a plurality of imaging elements 20 is formed by a semiconductor process. Furthermore, on the imaging element 20 formed on the wafer 11, there are selected and rearranged a plurality of logic circuits 21, which is formed on a wafer 12 by a semiconductor process, singulated into individual pieces, then electrically inspected individually, and confirmed to be non-defective chips; and a plurality of memory circuits 22, which is formed on a wafer 13 by a semiconductor process, singulated into individual pieces, then electrically inspected individually, and confirmed to be non-defective chips.

That is, the logic circuit 21 and the memory circuit 22 confirmed to be non-defective chips are rearranged on the imaging element 20. Thereafter, the wafer 12 is diced to generate a singulated imaging device.

With reference to FIGS. 2 to 6, a process of manufacturing the imaging device by the CoW technology will be described. In FIGS. 2 to 6, a case where the logic circuit 21 is rearranged on the imaging element 20 and the imaging device is generated will be described as an example.

Figure 2:
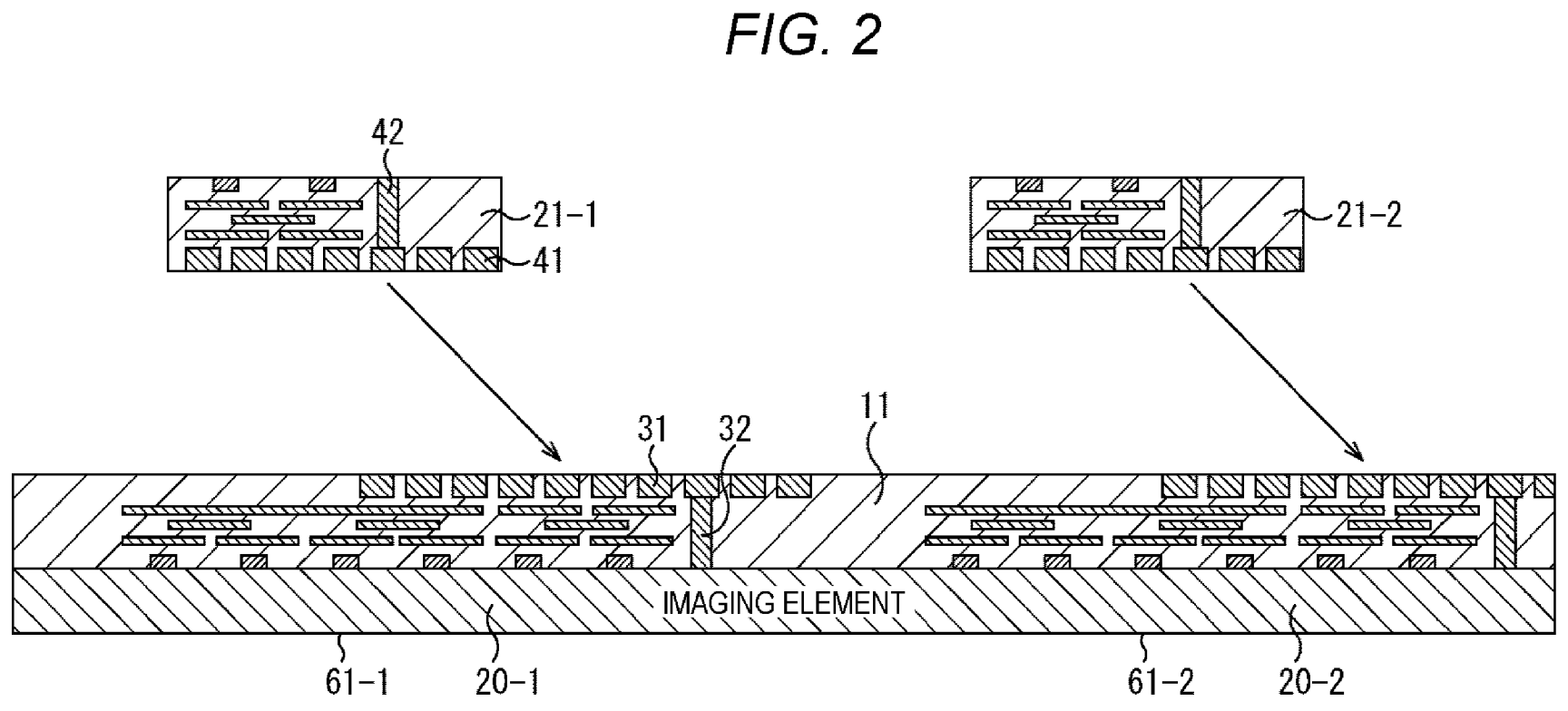
Figure 3:
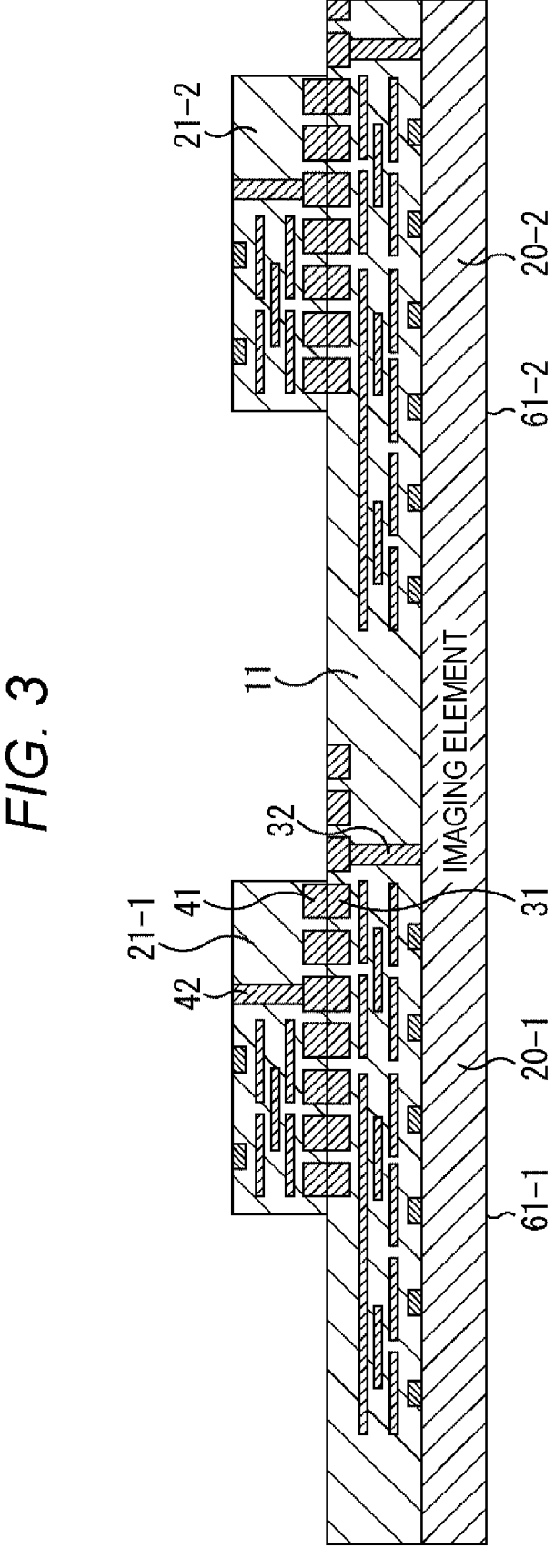
FIG. 3 is a diagram for explaining a manufacturing process of the imaging device with CoW.

As illustrated in FIG. 2, after the electrical inspection is performed, the logic circuit 21 confirmed to be a non-defective product is transferred to the imaging element 20 on the wafer 11, whereby the state illustrated in FIG. 3 is obtained.

FIGS. 2 and 3 illustrate an example in which a logic circuit 21-1 is transferred onto an imaging element 20-1 to be an imaging device 61-1, and a logic circuit 22-2 is transferred onto an imaging element 20-2 to be an imaging device 61-2. In the following description, in a case where it is not necessary to distinguish the logic circuit 21-1 and the logic circuit 21-2 individually, they are simply described as logic circuits 21. Other parts will be described in a similar manner.

The state illustrated in FIG. 3 is a state in which a terminal 41 of the logic circuit 21 and a terminal 31 of the imaging element 20 in the wafer 11 are aligned so as to appropriately face each other and connected by CuCu bonding.

In addition to the terminal 41, a guard ring 42 is also formed in the logic circuit 21. The guard ring 42 is provided to prevent the elements formed in the logic circuit 21 from being affected by dicing when the logic circuit 21 is diced from the wafer 12 to be singulated.

Figure 4:
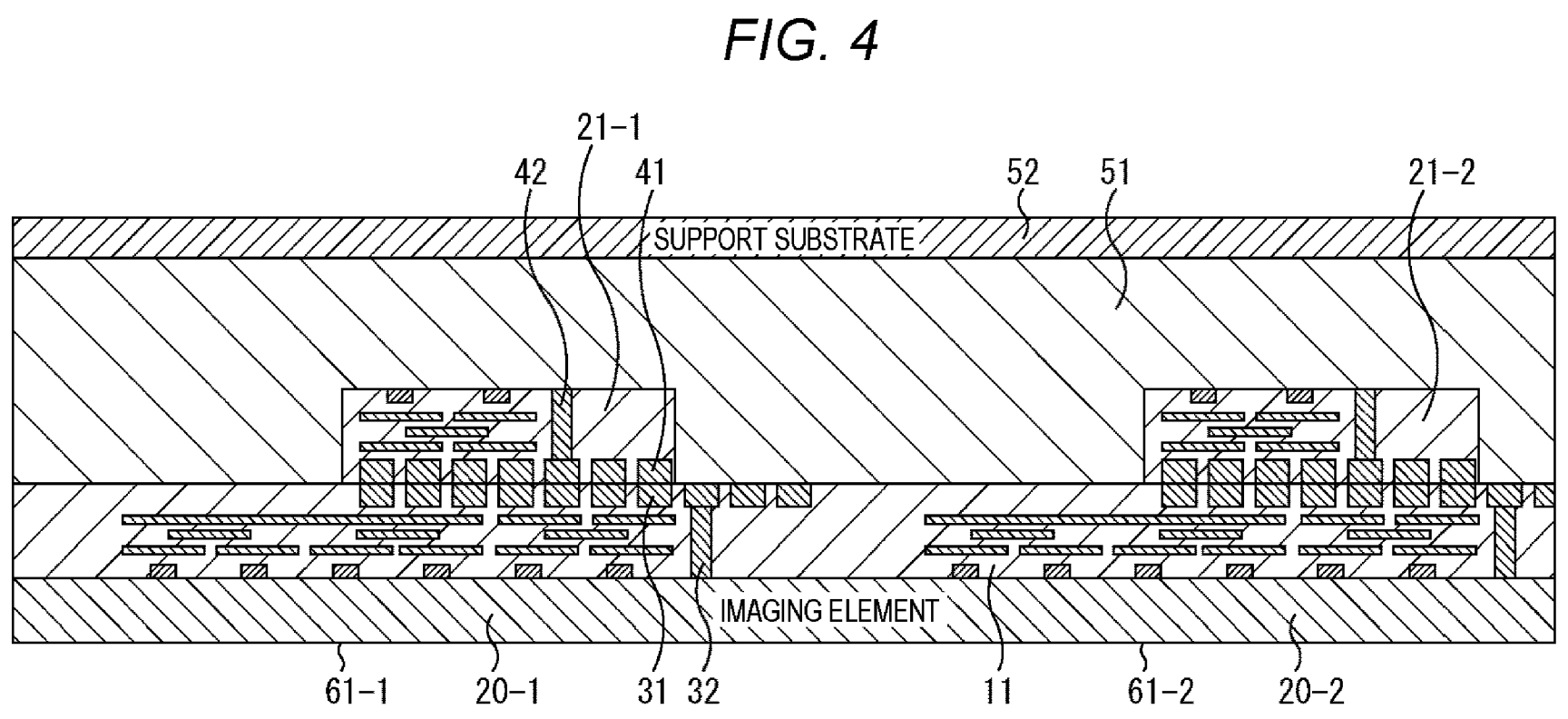

As a next step, as illustrated in FIG. 4, an oxide film 51 functioning as an insulating film is formed, and the rearranged logic circuit 21 is embedded. A support substrate 52 is bonded onto the formed oxide film 51.

Figure 5:
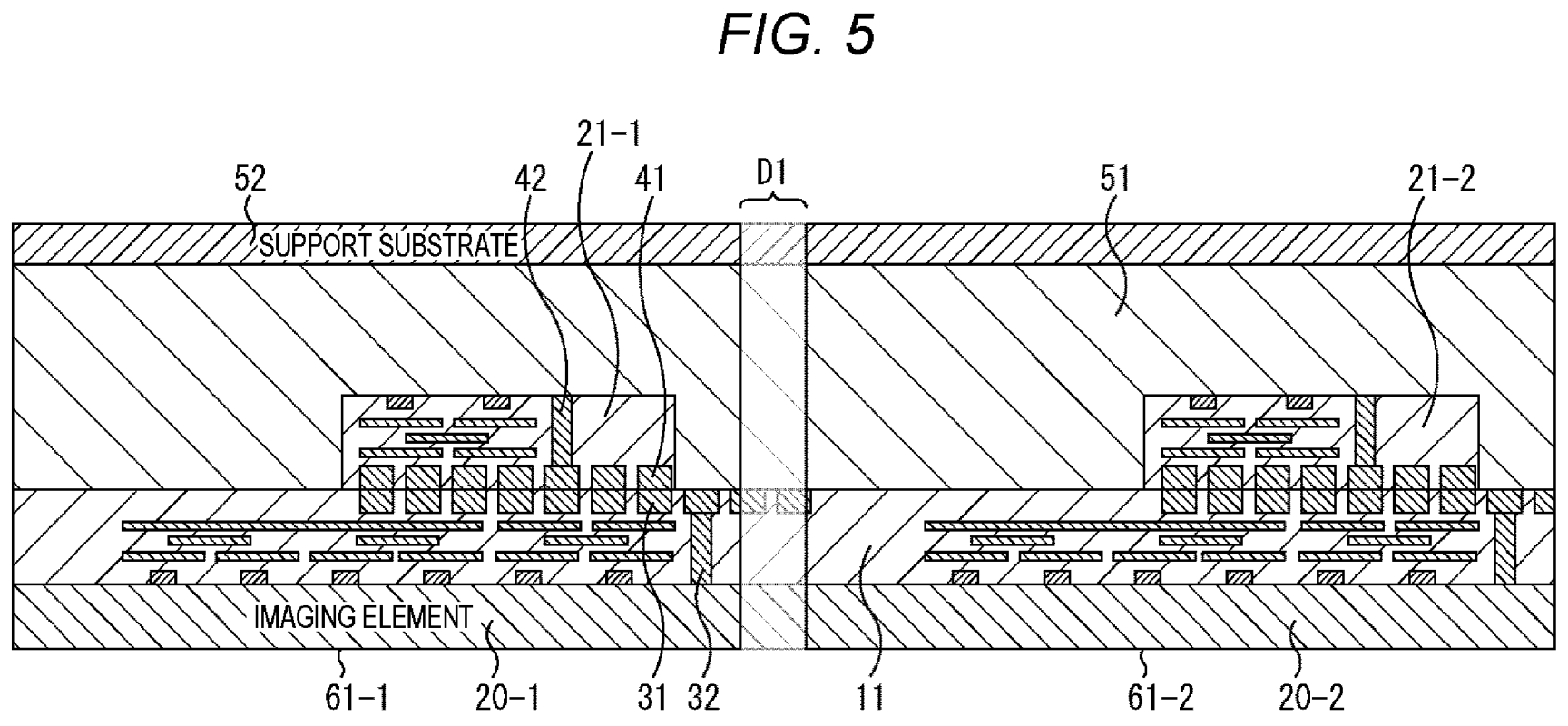
Figure 6:
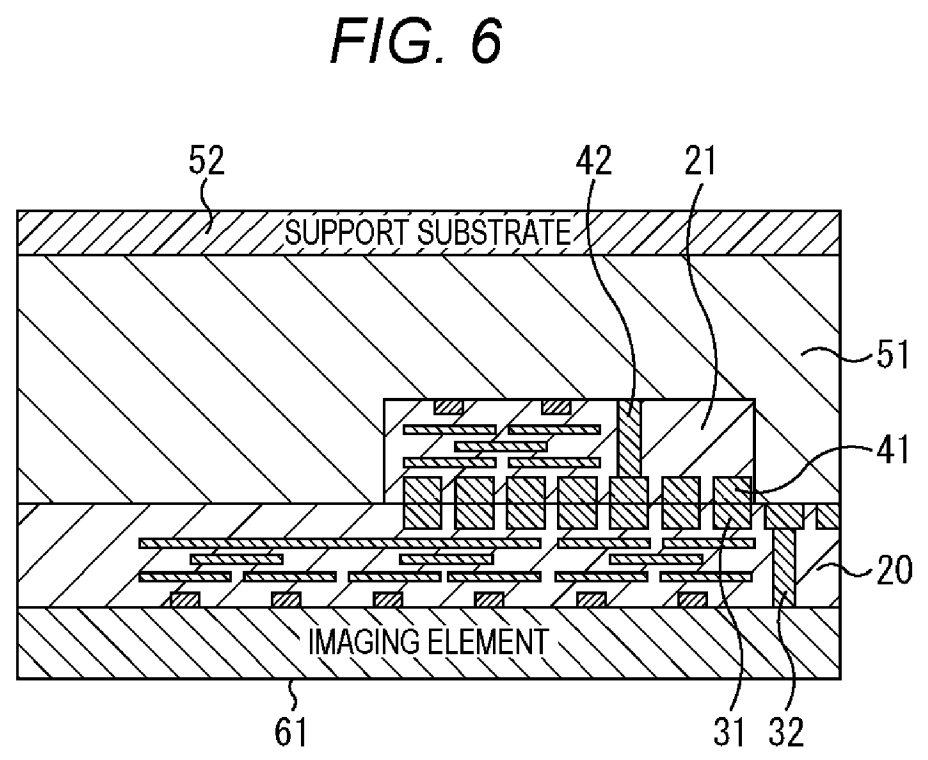

As illustrated in FIG. 5, dicing is performed at a position D1 to singulate the imaging device 61-1 and the imaging device 61-2. By singulating, the imaging device 61 as illustrated in FIG. 6 is generated.

A guard ring 32 is formed in the wiring layer of the imaging element 20 of the imaging device 61, and as illustrated in FIG. 5, the guard ring 32 is provided to protect the elements formed in the imaging element 20 from the influence of dicing when dicing is performed at the position D1.

In the imaging device 61, the logic circuit 21 is stacked on the imaging element 20, and the logic circuit 21 is included in the oxide film 51.

By the way, for example, when the wafer 12 (FIG. 1) is formed, measurement called pellet check is performed in the state of the wafer 12, and it is confirmed whether or not the chip is a non-defective chip. The pellet check evaluates characteristics of an element such as a transistor included in the logic circuit 21 formed on the wafer 12 alone, for example. In general, an element such as a transistor for evaluation is formed at an appropriate place, and a probe needle is brought into contact with a measurement electrode pad formed so that the element such as the transistor can be measured to measure the characteristic.

A region formed for pellet check is defined as a 1PC region 71. As illustrated in FIG. 7A, the 1PC region 71 is formed at a predetermined position for each logic circuit 21. Before the logic circuit 21 is singulated, that is, in the state of the wafer 12, as illustrated in the upper diagram in FIG. 7A, a 1PC region 71 is formed in the vicinity of the logic circuit 21 for each logic circuit 21.

In the 1PC region 71, for example, an electrode pad for measurement for evaluating an element alone, a dummy transistor, and the like are arranged. In the configuration illustrated in FIG. 7A, a 1PC region 71 is formed outside the region to be the logic circuit 21. The 1PC region 71 is a region to be diced when singulated. Therefore, as illustrated in the lower diagram of FIG. 7A, the logic circuit 21 without the 1PC region 71 is transferred to the wafer 11.

Figure 7B:
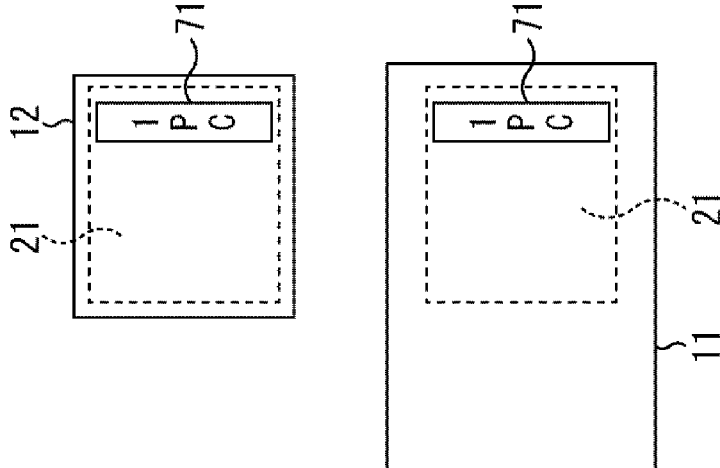
FIGS. 7A and 7B are diagrams for explaining a chip configuration including a 1PC region.
Figure 7A:
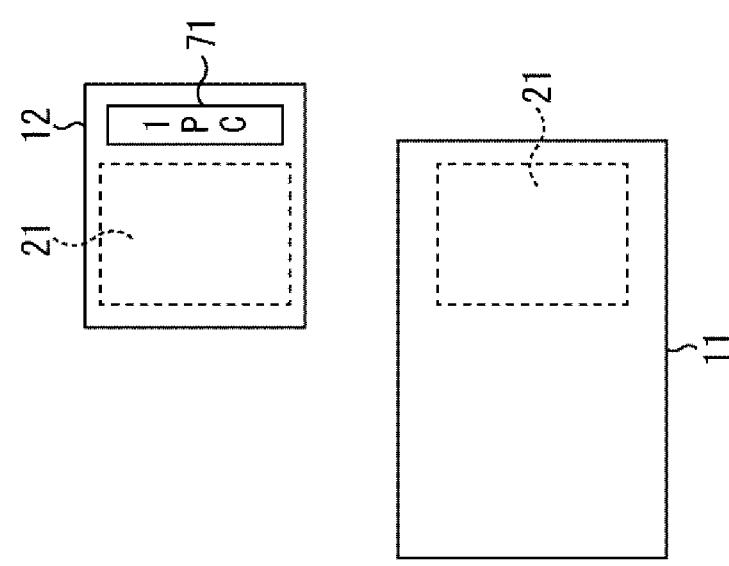

Alternatively, as illustrated in the upper diagram of FIG. 7B, the 1PC region 71 may be formed in a region to be the logic circuit 21. In this case, when the logic circuit 21 is singulated from the wafer 12, the logic circuit 21 in a state including the 1PC region 71 is singulated. Therefore, as illustrated in the lower diagram of FIG. 7B, the logic circuit 21 including the 1PC region 71 is transferred to the wafer 11.

As illustrated in FIG. 7A, in a case where the 1PC region 71 is arranged in the dicing region, and the logic circuit 21 is transferred to the wafer 11 after being cut when being singulated, the logic circuit 21 cannot be evaluated after being mounted on the wafer 11. After the logic circuit 21 is mounted on the wafer 11, the characteristics of the logic circuit 21 may change, and there is a demand for performing evaluation even after CoW.

As illustrated in FIG. 7B, by forming the 1PC region 71 in the logic circuit 21, the characteristics of the logic circuit 21 can be evaluated even after CoW, but there are problems that the chip size of the logic circuit 21 is increased, downsizing is hindered, and cost cannot be reduced.

An imaging device capable of evaluating the logic circuit 21 even after CoW without increasing the chip size and a method of manufacturing the imaging device will be described below. Note that, here, the logic circuit 21 has been described as an example, but it similarly applies to the memory circuit 22 and other chips.

Figure 8:
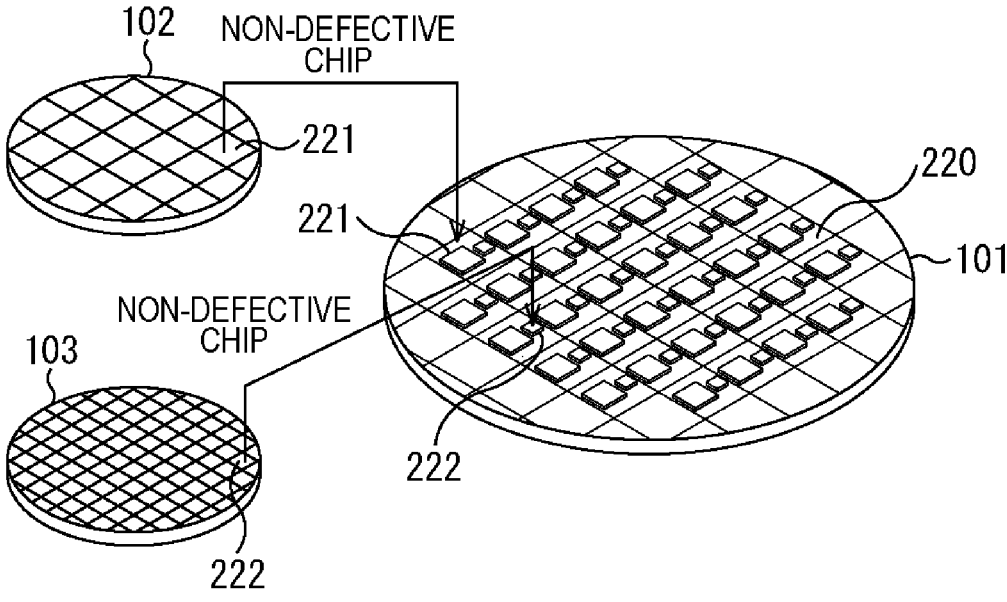
FIG. 8 is a diagram for explaining CoW.

Configuration and Manufacturing of Imaging Device to which Present Technology is Applied The CoW technology to which the present technology is applied will be described with reference to FIGS. 8 and 9. In a wafer 101, a plurality of imaging elements 220 is formed by a semiconductor process. Furthermore, on the imaging element 220 formed on the wafer 101, there are selected and rearranged a plurality of logic circuits 221, which is formed on a wafer 102 by a semiconductor process, singulated into individual pieces, then electrically inspected individually, and confirmed to be non-defective chips; and a plurality of memory circuits 222, which is formed on a wafer 103 by a semiconductor process, singulated into individual pieces, then electrically inspected individually, and confirmed to be non-defective chips.

That is, the logic circuit 221 and the memory circuit 222 confirmed to be non-defective chips are rearranged on the imaging element 220. Thereafter, the wafer 101 is diced to generate a singulated imaging device.

Here, a case where the semiconductor chip is the imaging element 220, the logic circuit 221, and the memory circuit 222 will be described as an example, but the semiconductor chip is not limited to these chips. The present technology can be applied to an apparatus having a step of stacking semiconductor chips and an apparatus manufactured by such a step.

Figure 9:
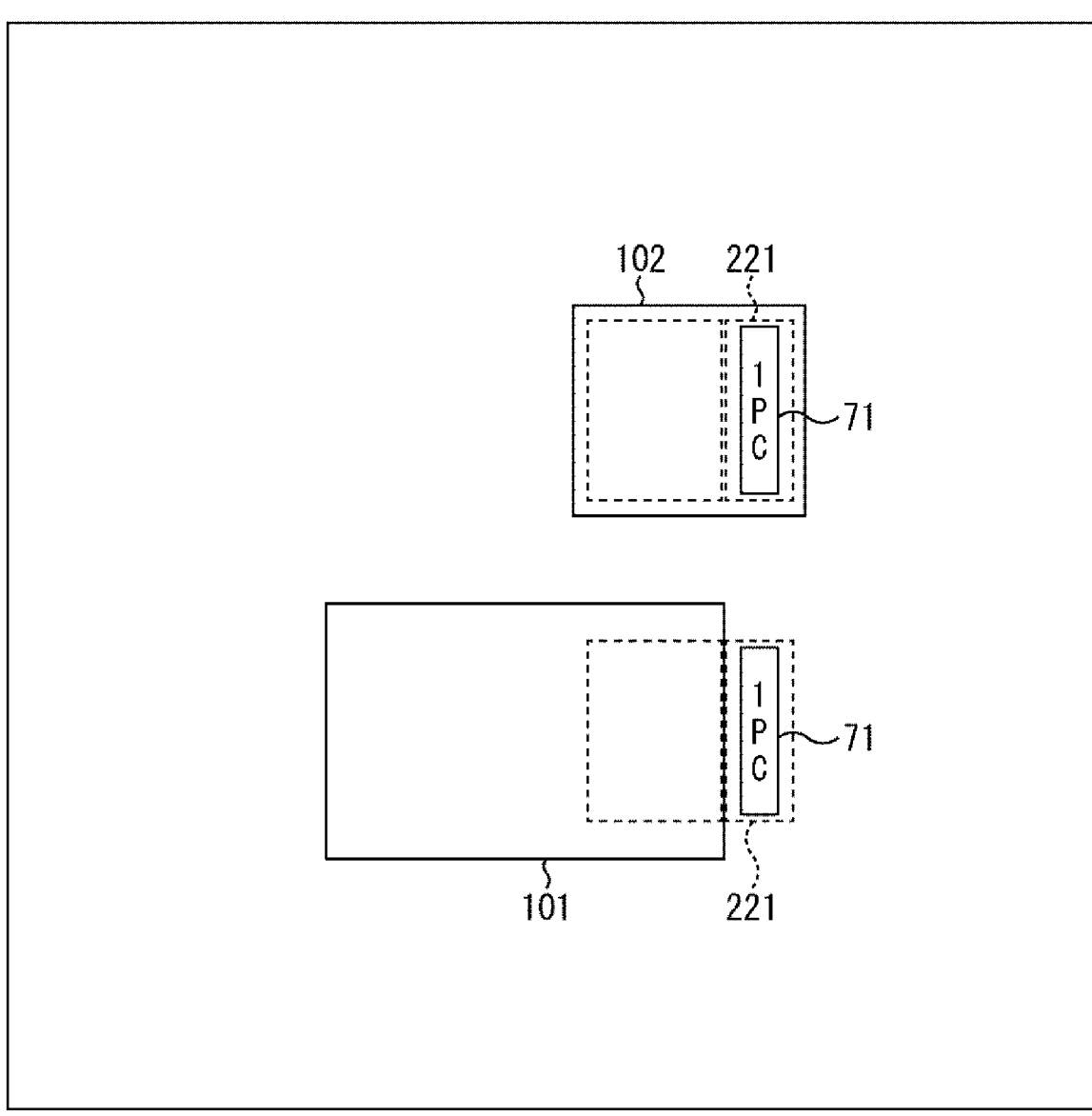
FIG. 9 is a diagram for explaining a chip configuration including a 1PC region.

As illustrated in the upper diagram of FIG. 9, the logic circuit 221 formed on the wafer 102 includes the 1PC region 71. In addition, the logic circuit 221 is singulated from the wafer 102 in a state of including the 1PC region 71. The singulated logic circuit 221 including the 1PC region 71 is transferred onto the imaging element 220 of the wafer 101. Since the logic circuit 221 including the 1PC region 71 is transferred to the wafer 101, the logic circuit 221 can be evaluated even after the transfer.

When the logic circuit 221 is transferred to the wafer 101, the 1PC region 71 included in the logic circuit 221 is transferred to a position overlapping a region to be scribed when the wafer 101 is diced. Therefore, when the wafer 101 is diced, the 1PC region 71 of the logic circuit 221 is also diced, and the singulated imaging device does not include the 1PC region 71. Therefore, it is possible to prevent an increase in the chip size and to prevent hindrance of downsizing of the imaging device.

A process of manufacturing the imaging device by the CoW technology described with reference to FIG. 9 will be further described with reference to FIGS. 10 to 14. The imaging device to be manufactured will be referred to as an imaging device 261a as an imaging device in the first embodiment. Here, a case where the logic circuit 221 is transferred to the wafer 101 will be described as an example.

Figure 10:
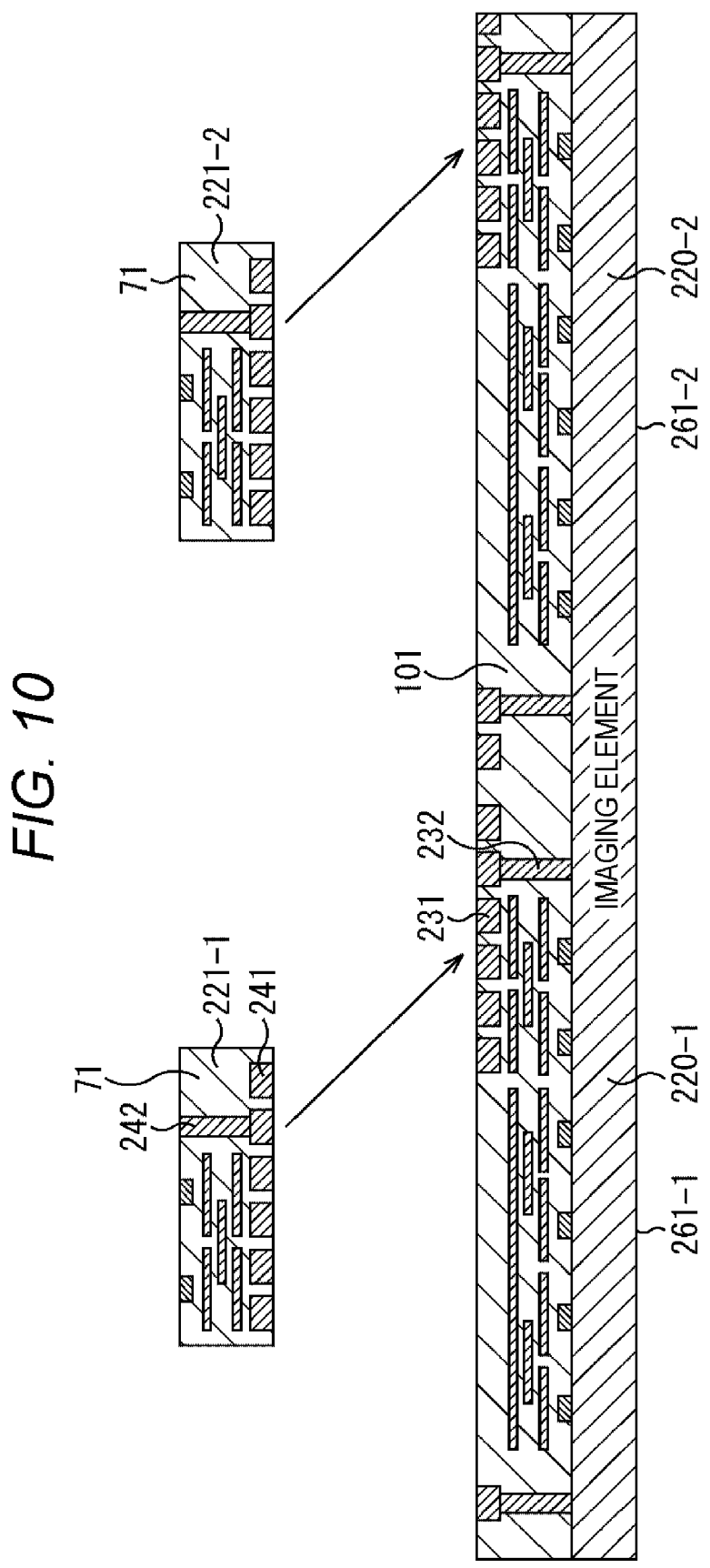
FIG. 10 is a diagram for explaining a configuration of an imaging device in a first embodiment.

As illustrated in FIG. 10, after the electrical inspection is performed, the logic circuit 221 confirmed to be a non-defective product is transferred to the imaging element 220 on the wafer 101. The logic circuit 221 to be transferred includes the 1PC region 71. In FIG. 10, the right side of the logic circuit 221 is the 1PC region 71. The 1PC region 71 is provided outside a guard ring 242 (right side in the drawing).

The guard ring 242 of the logic circuit 221 is provided to protect the elements in the logic circuit 221 when the logic circuit 221 is singulated from the wafer 102. In addition, as will be described later, since the logic circuit 221 is transferred to the wafer 101 and then diced together with the wafer 101 again, the guard ring 242 is provided to protect the elements and the like from the dicing at that time.

When the logic circuit 221 is singulated from the wafer 102, silicon (Si) constituting the wafer 102 is processed in a process such as dry etching or dicing. During this processing, there is a possibility that silicon is scratched due to silicon chips, damage, or the like, and this scratch may propagate. In order to prevent such a situation, the guard ring 242 is provided in the logic circuit 221.

The guard ring 242 is a structure that is included in the logic circuit 221 and formed in a ring shape, and is configured to protect elements and the like located in the ring. For example, a portion indicated by a dotted line in FIG. 9 corresponds to a guard ring, and the guard ring is formed in a ring shape in a peripheral portion of a chip (logic circuit 221 or the like). The guard ring 242 is constituted by, for example, a metal film such as aluminum (Al) or an insulating film such as a silicon oxide film (SiO2). Here, the guard ring 242 has been described as an example, but it similarly applies to other guard rings, for example, a guard ring 232 and the like.

Figure 11:
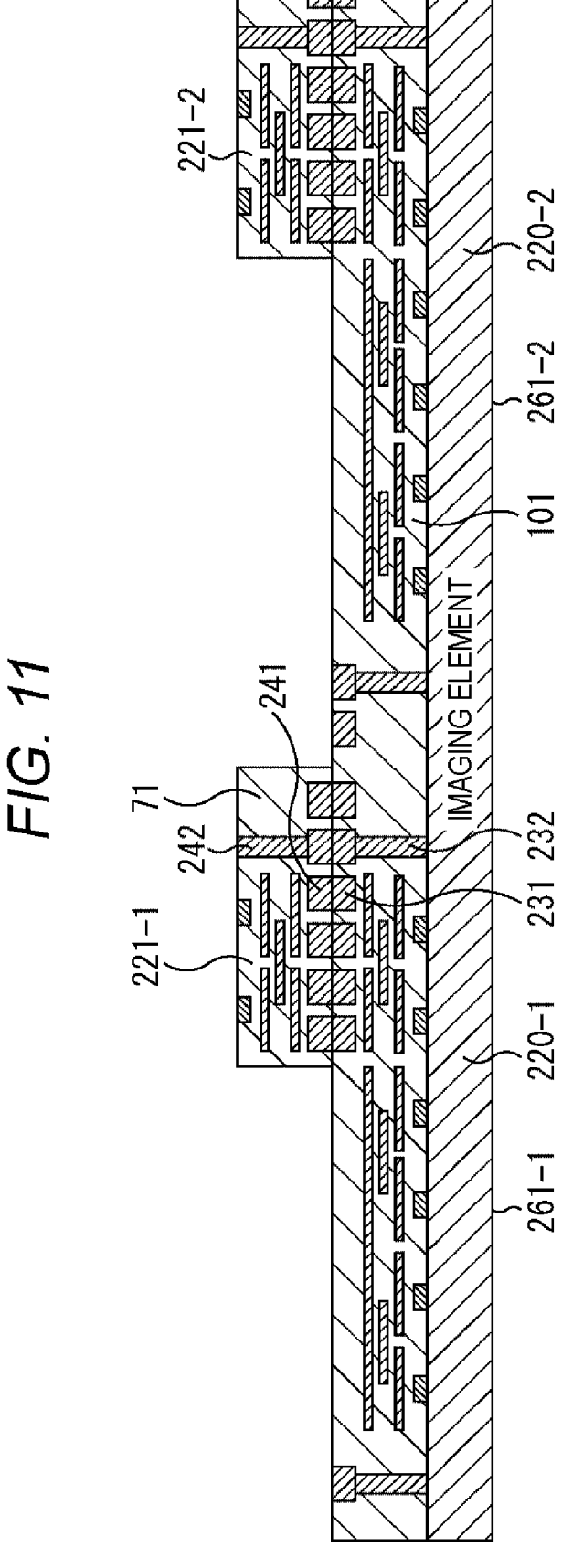
FIG. 11 is a diagram for explaining a configuration of the imaging device in the first embodiment.

When the logic circuit 221 is transferred to the wafer 101, a state illustrated in FIG. 11 is obtained. In FIG. 11, a logic circuit 221-1 is transferred onto an imaging element 220-1 to be an imaging device 261-1, and a logic circuit 221-2 is transferred onto an imaging element 220-2 to be an imaging device 261-2.

The state illustrated in FIG. 11 is a state in which a terminal 241 of the logic circuit 221 and a terminal 231 of the imaging element 220 in the wafer 101 are aligned so as to appropriately face each other and connected by CuCu bonding. Here, the appropriately opposed position is a position where the 1PC region 71 included in the logic circuit 221 and the dicing region of the wafer 101 overlap.

Figure 12:
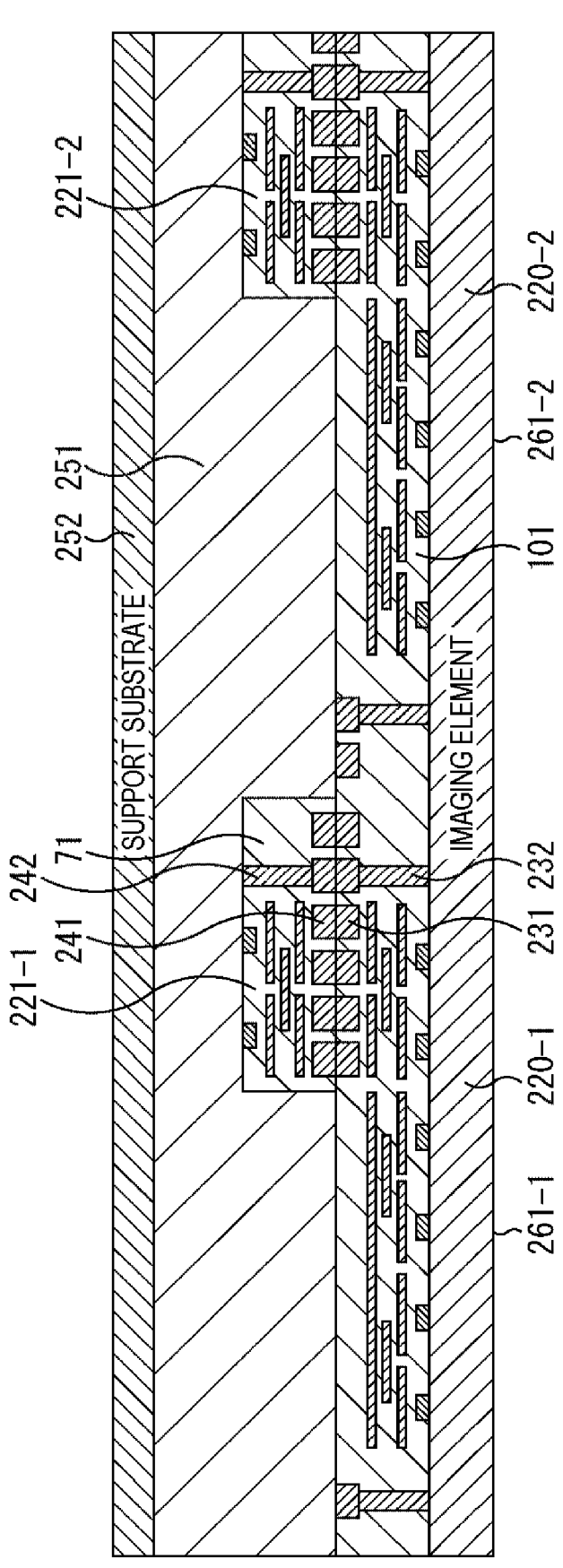
FIG. 12 is a diagram for explaining a configuration of the imaging device in the first embodiment.

As a next step, as illustrated in FIG. 12, an oxide film 251 functioning as an insulating film is formed, and the rearranged logic circuit 221 is embedded. A support substrate 252 is bonded onto the formed oxide film 251.

Although not illustrated, after that, a photodiode by a PN bonding is formed on the imaging element 220 side, or a color filter or an on-chip lens is stacked, so that the imaging device 261 before singulation is generated.

Figure 13:
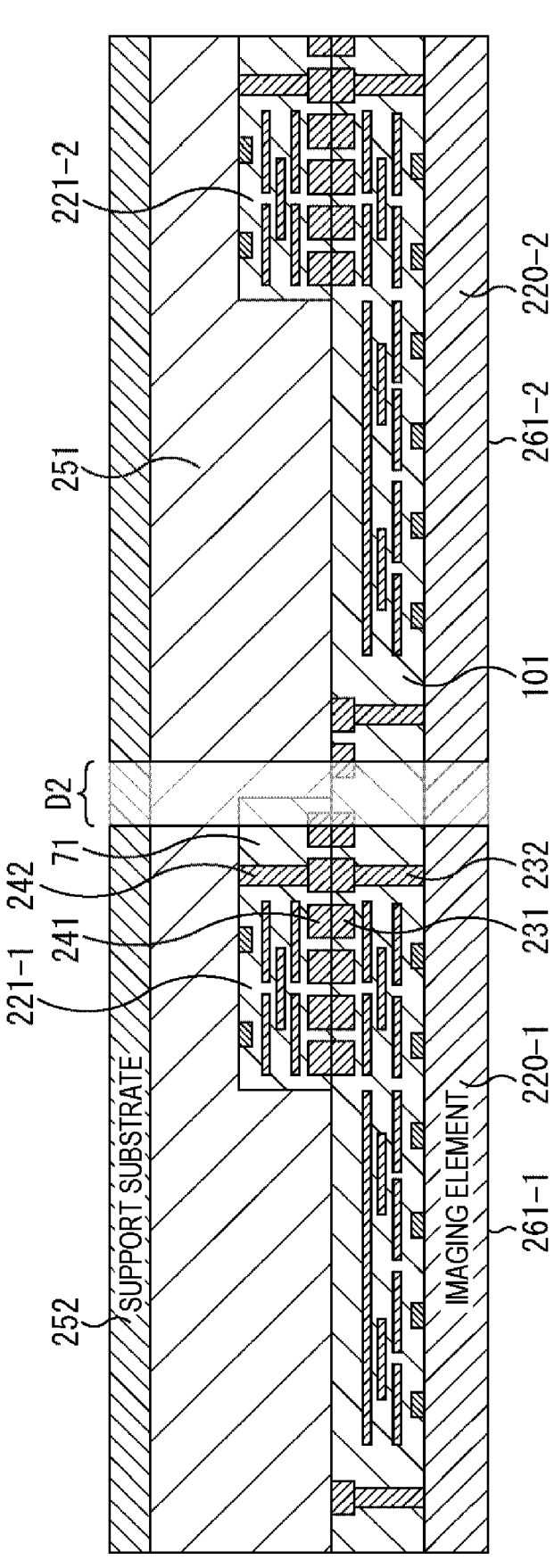
FIG. 13 is a diagram for explaining a configuration of the imaging device in the first embodiment.

As illustrated in FIG. 13, dicing is performed at a position D2 to singulate the imaging device 261-1 and the imaging device 261-2. Since the 1PC region 71 is stacked on the wafer 101 at the dicing position D2, the stacked logic circuit 221 is also diced when the wafer 101 is diced. By singulating, the imaging device 261a as illustrated in FIG. 14 is manufactured.

The guard ring 232 is formed in the wiring layer of the imaging element 220 of the imaging device 261a, and as illustrated in FIG. 13, the guard ring 232 is provided to protect the elements formed in the imaging element 220 from the influence of dicing when dicing is performed at the position D2.

Similarly, the guard ring 242 formed in the logic circuit 221 is provided to protect the formed elements in the logic circuit 221 from the influence of dicing when dicing is performed at the position D2.

Figure 14:
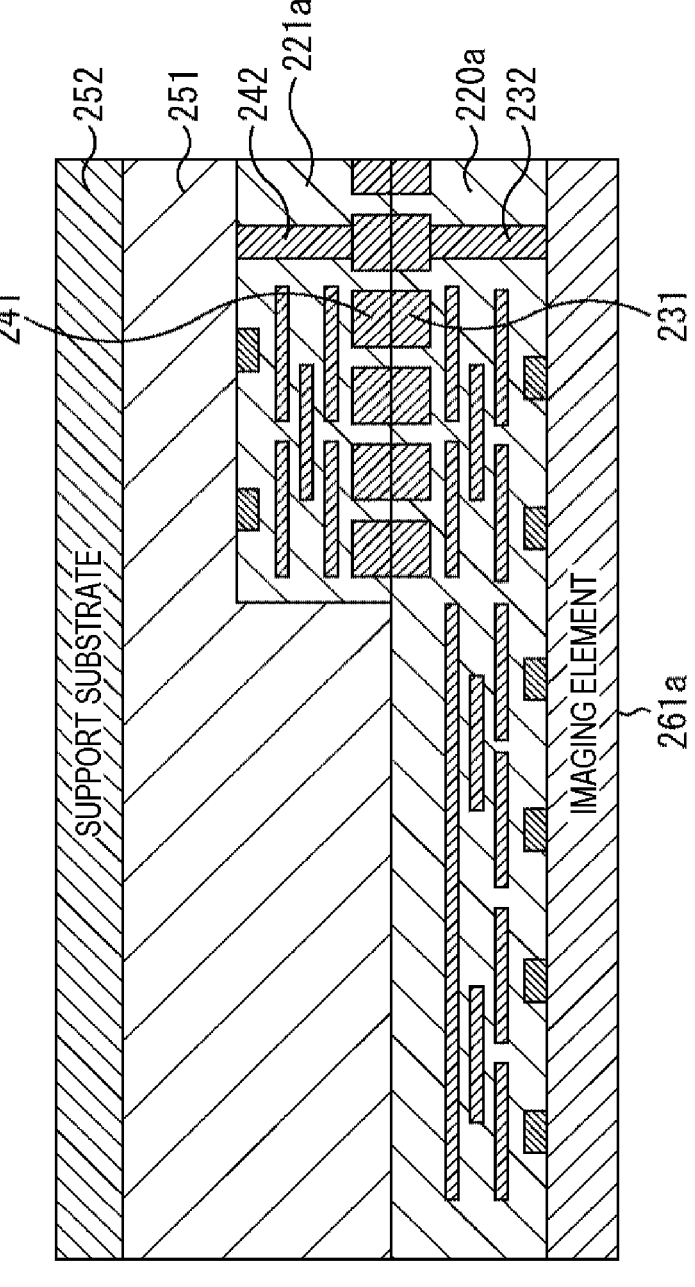
FIG. 14 is a diagram for explaining a configuration of the imaging device in the first embodiment.

In the imaging device 261a illustrated in FIG. 14, an example is illustrated in which the guard ring 231 and the guard ring 241 are bonded so as to be on a straight line. Although a configuration in which a terminal for bonding the guard ring 231 and the guard ring 242 is provided is illustrated, in a case where a portion of the terminal is also referred to as a guard ring, the imaging device 261a is configured such that guard rings in different chips are connected to each other.

In this manner, the guard ring 231 and the guard ring 242 are disposed and connected at substantially the same position in the stacking direction (longitudinal direction in the drawing).

The guard ring 231 and the guard ring 242 may be disposed at different positions in the stacking direction. As will be described later as a fourth embodiment, it is also possible to adopt a configuration in which a guard ring is not connected.

The imaging device 261a is configured such that the imaging element 220 and the logic circuit 221 are stacked, a part of the logic circuit 221 is included in the oxide film 51, and a part thereof is not provided with the oxide film 51.

The imaging device 261a illustrated in FIG. 14 has a structure in which a logic circuit 221a is stacked on an imaging element 220a. The end surfaces of the imaging element 220a and one surface of the logic circuit 221a are aligned by dicing, and for example, the silicon substrate is exposed. Note that the exposed portion may be processed as appropriate, for example, an oxide film may be formed on the exposed portion after dicing instead of the silicon substrate being exposed.

In at least one of the side surfaces of the imaging device 261a, end surfaces (in FIG. 14, the surface on the right side in the drawing) of the imaging element 220a and the logic circuit 221a are located. In other words, at least one of the side surfaces of the imaging element 220a and at least one of the side surfaces of the logic circuit 221a are on the same plane, and the same plane is one of the side surfaces of the imaging device 261a.

Depending on the dicing method and the position, the wiring of the 1PC region 71 formed in the logic circuit 221a may remain. In the logic circuit 221a illustrated in FIG. 14, a state is illustrated in which a part of the wiring formed in the 1PC region 71 remains on the left side of the guard ring 242 in the drawing.

By forming the imaging device 261a as described above, the logic circuit 221a is arranged at a position straddling the guard ring 232 formed in the imaging element 220a.

The imaging device 61 illustrated in FIG. 6 will be referred to again for comparison. The imaging device 61 illustrated in FIG. 6 is formed in a state where there is no portion over which the logic circuit 21 straddles on the guard ring 32 formed in the imaging element 20. In addition, the logic circuit 21 is included in the oxide film 51 and is not disposed at a position where the end surface is exposed.

In contrast to the imaging device 61 illustrated in FIG. 6, in the imaging device 261a illustrated in FIG. 14, the logic circuit 221a is located so as to straddle the guard ring 232 formed in the imaging element 220a, and on the upper side of the guard ring 232 in the drawing. In addition, the end surface of the logic circuit 21 has a surface aligned with the end surface of the imaging element 220a, and has a surface exposed to the outside of the oxide film 251.

As described above, the imaging device 261a generated by dicing the 1PC region 71 of the logic circuit 221a when the wafer 101 is diced after the logic circuit 221a is transferred to the wafer 101 while the 1PC region 71 is included in a part of the logic circuit 221a has the above-described configuration. That is, the generated imaging device 261a does not include the 1PC region 71.

In the imaging device 261a as described above, in the manufacturing process, the logic circuit 221a is subjected to the first dicing when the wafer 102 is singulated, and is subjected the second dicing simultaneously with the dicing of the wafer 101 when the wafer 101 is singulated after transferred to the wafer 101. As described above, the logic circuit 221a is subjected to dicing twice, and the imaging device 261a as described above is manufactured by dicing.

Since the logic circuit 221a included in the manufactured imaging device 261a does not include the 1PC region 71, it is possible to prevent the size of the logic circuit 221*a* from increasing and to provide the imaging device 261*a* that does not hinder downsizing.

When the logic circuit 221*a* is transferred to the wafer 101, the logic circuit 221*a* is transferred in a state where the 1PC region 71 is present in the logic circuit 221*a*, so that the logic circuit 221*a* can be evaluated even after the transfer.

Imaging Device in Second Embodiment

Figure 15:
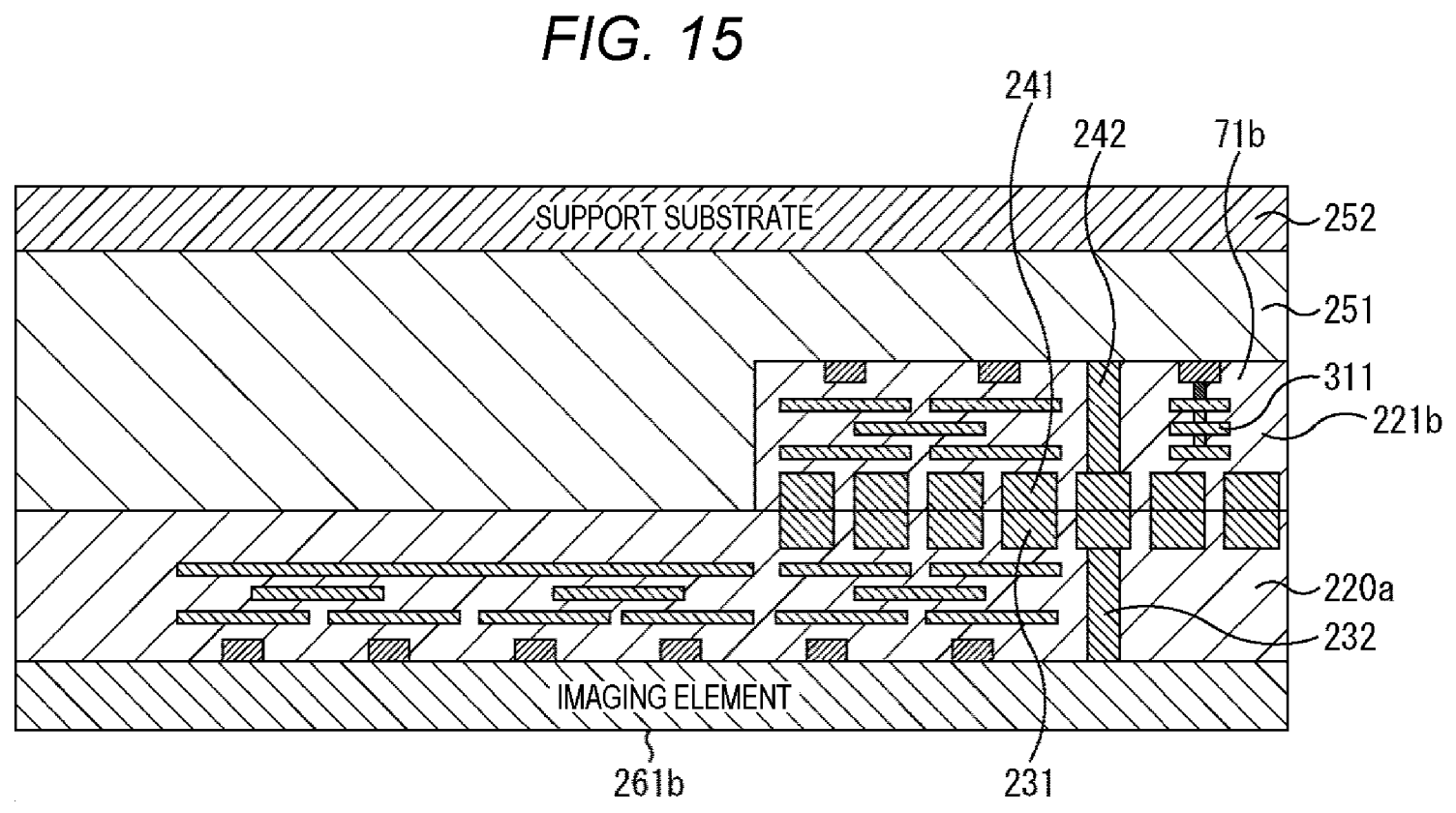
Figure 16:
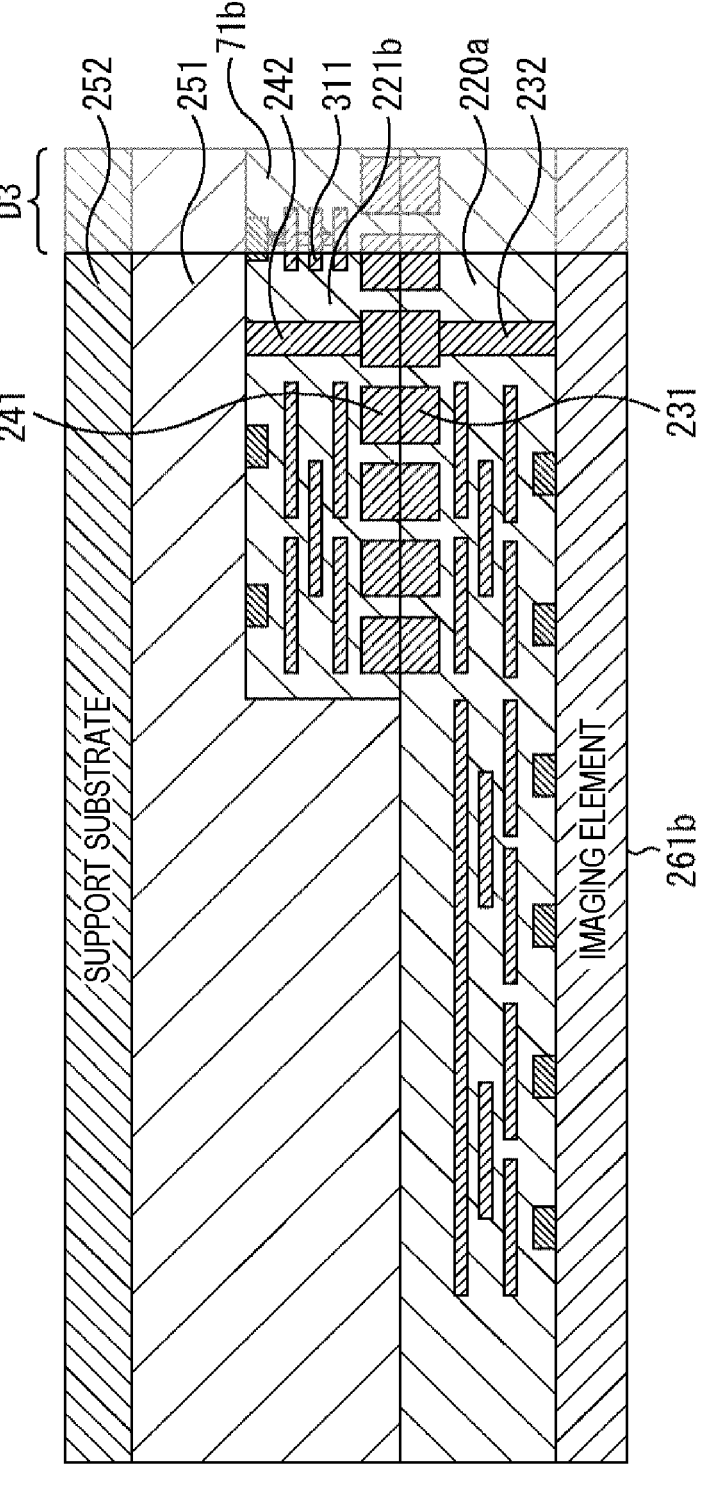
FIG. 16 is a diagram for explaining a configuration of the imaging device in the second embodiment.
Figure 17:
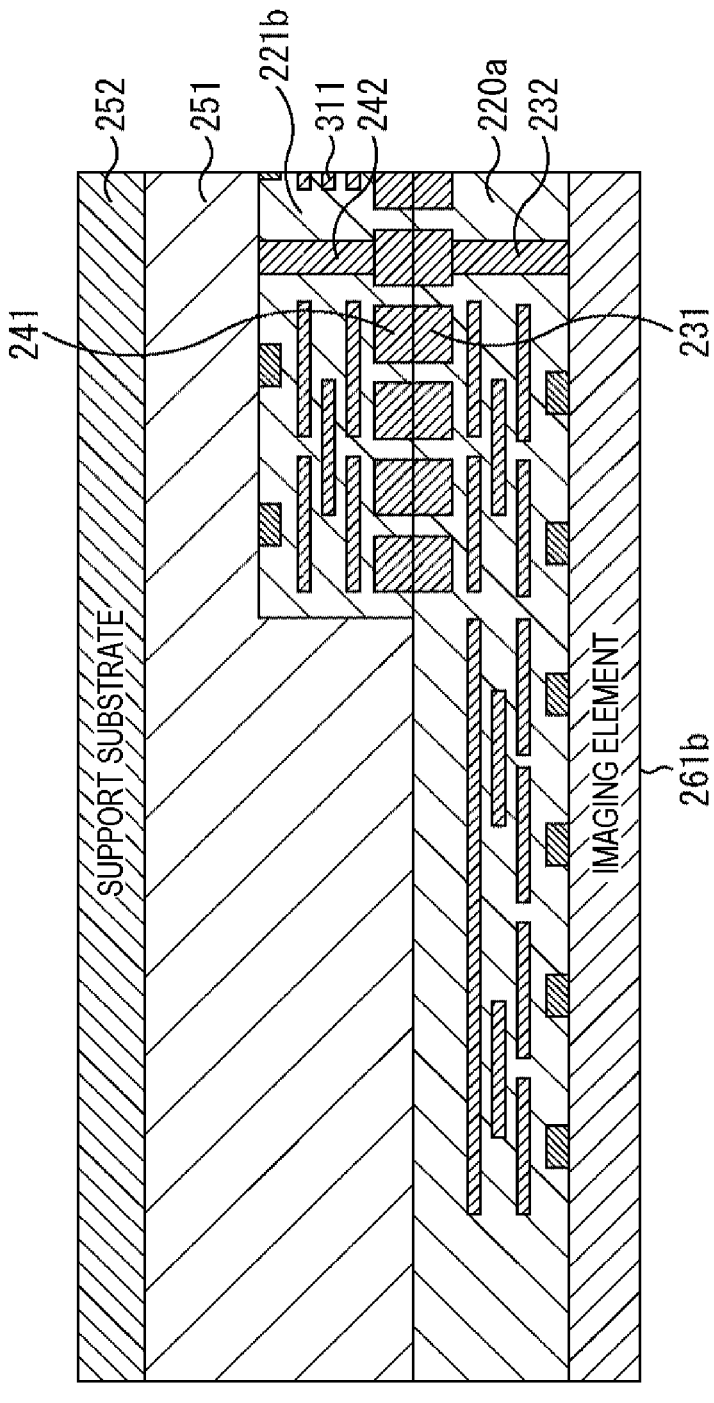
FIG. 17 is a diagram for explaining a configuration of the imaging device in the second embodiment.

A configuration and manufacturing of an imaging device 261*b* according to a second embodiment will be described with reference to FIGS. 15 to 17. In FIGS. 15 to 17, similar components to those of the imaging device 261*a* in the first embodiment are denoted by the same reference numerals, and the description thereof will be appropriately omitted.

FIG. 15 illustrates a state in which a logic circuit 221*b* is transferred to the imaging element 220*a* of the wafer 101, the oxide film 251 is formed, and the support substrate 252 is stacked. The state of the imaging device 261*b* illustrated in FIG. 15 corresponds to the state of the imaging device 261*a* illustrated in FIG. 12.

In the embodiment described below, one imaging device 261 and a dicing region (1PC region 71) will be illustrated and described as a state of the imaging device 261 in the middle of manufacturing, but as in the case described with reference to FIG. 12, a plurality of imaging elements 220 formed on the wafer 101 is present in the middle of manufacturing, and a logic circuit 221 is transferred onto each of the plurality of imaging elements 220.

The imaging device 261*b* in the second embodiment is different from the imaging device 261*a* in the first embodiment in that an element 311 is included in a 1PC region 71*b* of the logic circuit 221*b*, and the rest is the same.

The logic circuit 221*b* is a logic circuit 221*b* determined as a non-defective product, and is in a state of being transferred onto the imaging element 220*a* of the wafer 101 in a state of including the 1PC region 71*b*.

The element 311 is formed in the 1PC region 71*b* of the logic circuit 221*b*. The element 311 is, for example, an element such as a transistor, and is an element to be evaluated. As described above, the element 311 can be included in the 1PC region 71*b* provided in the logic circuit 221*b*.

As illustrated in FIG. 16, the 1PC region 71*b* including the element 311 is located at a position D3 where dicing is performed, and is set as a dicing target region together with the wafer 101. As illustrated in FIG. 16, by performing dicing at the position D3, the wafer 101 is singulated into individual pieces, and the imaging device 261*b* as illustrated in FIG. 17 is manufactured.

Before the wafer 101 in the second embodiment is diced, the element 311 is included in the 1PC region 71*b* included in the logic circuit 221*b*, and dicing is performed including the element 311.

Similarly to the imaging device 261*a* in the first embodiment, in the imaging device 261*b* in the second embodiment, the logic circuit 221*b* is subjected to dicing twice at the time of manufacture. In a state after the second dicing is performed, that is, the imaging device 216*b* has a structure in which the end surfaces of the imaging element 220*a* and the logic circuit 221*b* are aligned, and a part of the silicon substrate or the wiring is exposed at the end surface.

In the imaging device 261*b* according to the second embodiment, similarly to the imaging device 261*a* according to the first embodiment, the logic circuit 221*b* is disposed at a position across the guard ring 232 in the imaging element 220*a*.

Also in the imaging device 261*b* according to the second embodiment, it is possible to prevent the size of the logic circuit 221*b* from increasing and to prevent the downsizing from being hindered. In addition, when the logic circuit 221*b* is transferred to the wafer 101, the logic circuit 221*b* is transferred in a state where the 1PC region 71*b* is present in the logic circuit 221*b*, so that the logic circuit 221*b* can be evaluated after the transfer.

Imaging Device in Third Embodiment

Figure 18:
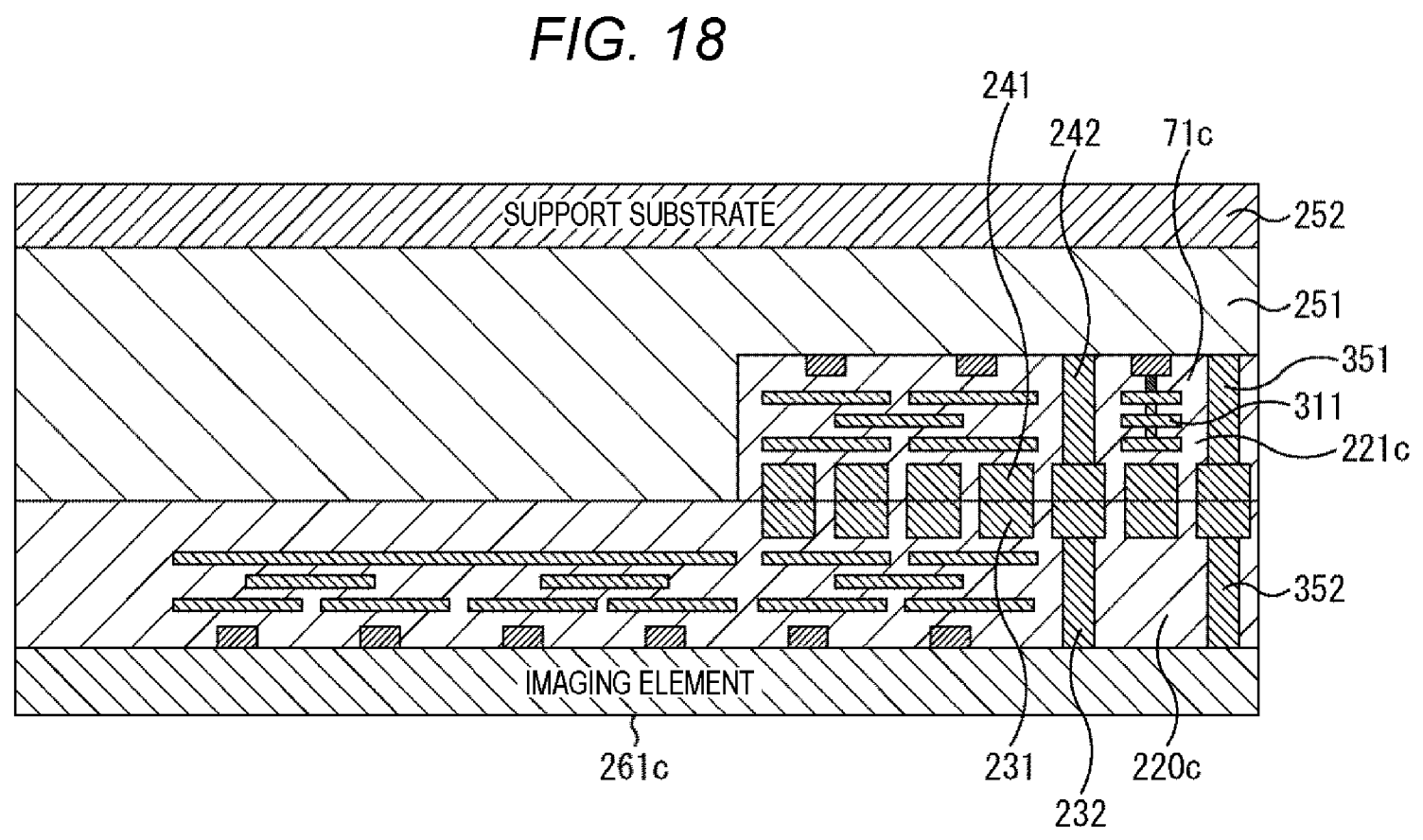
Figure 19:
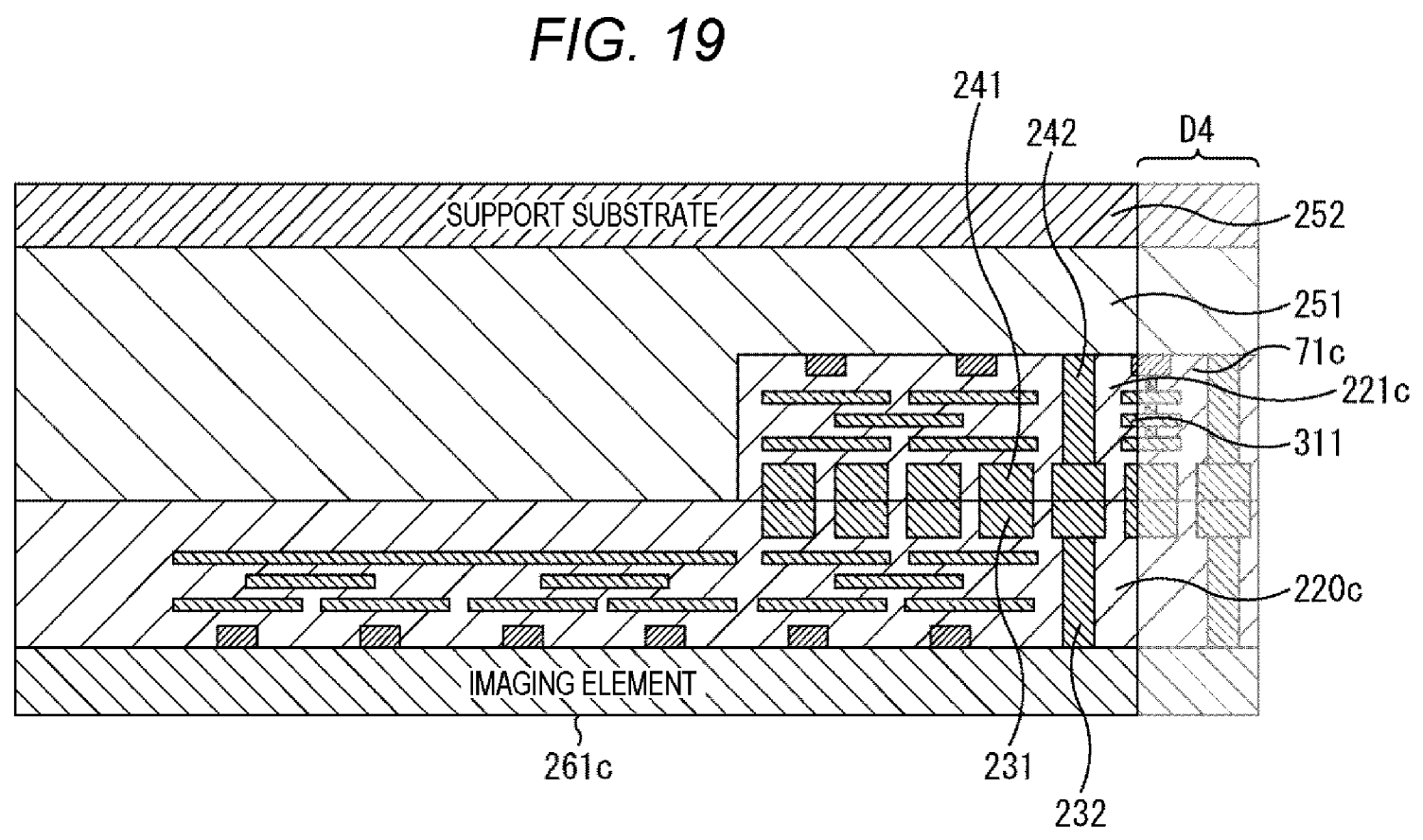
Figure 20:
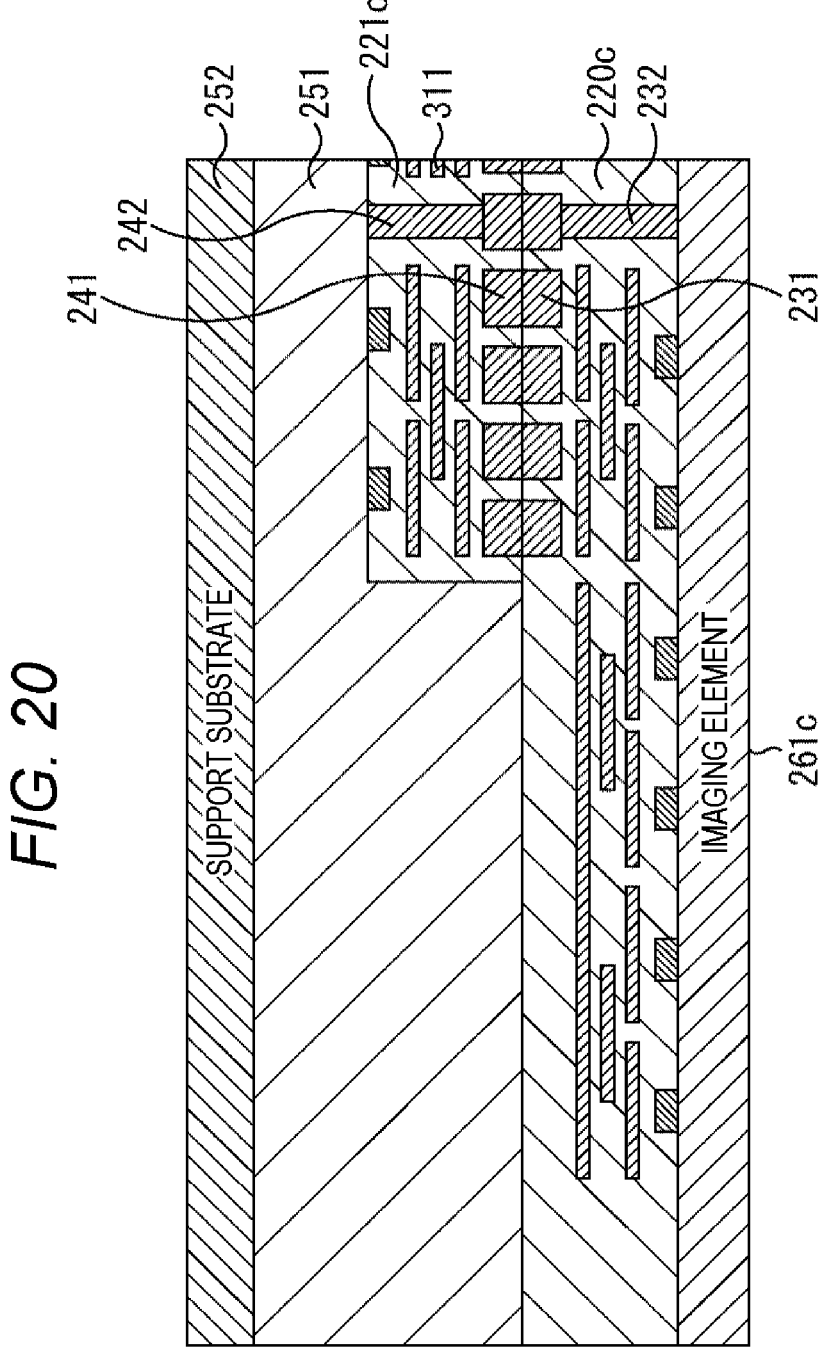
FIG. 20 is a diagram for explaining a configuration of the imaging device in the third embodiment.

A configuration and manufacturing of an imaging device 261*c* according to a third embodiment will be described with reference to FIGS. 18 to 20. In FIGS. 18 to 20, similar components to those of the imaging device 261*b* in the second embodiment are denoted by the same reference numerals, and the description thereof will be appropriately omitted.

FIG. 18 illustrates a state in which a logic circuit 221*c* is transferred to an imaging element 220*c* of the wafer 101, the oxide film 251 is formed, and the support substrate 252 is stacked. The imaging device 261*c* according to the third embodiment is different from the imaging device 261*b* according to the second embodiment in that a 1PC region 71*c* of the logic circuit 221*c* of the imaging device 261*c* includes a guard ring 351 for protecting the element 311 from the influence of dicing at the time of dicing.

The imaging device 261*c* according to the third embodiment is different from the imaging device 261*b* according to the second embodiment in that a guard ring 352 is formed at a position corresponding to the guard ring 351 provided in the logic circuit 221*c* of the imaging element 220*c* as well.

The state of the imaging device 261*c* illustrated in FIG. 18 corresponds to the state of the imaging device 261*b* illustrated in FIG. 15. The logic circuit 221*c* is a logic circuit 221*c* determined as a non-defective product, and is in a state of being transferred onto the imaging element 220*c* of the wafer 101 in a state of including the 1PC region 71*c*.

In the 1PC region 71*c* of the logic circuit 221*c*, the element 311 and the guard ring 351 are formed. The guard ring 351 is formed to protect the element 311 from the influence of the first dicing. The first dicing is dicing performed when the wafer 102 is singulated to generate the logic circuit 221*c*.

In this manner, the element 311 and the guard ring 351 may be included in the 1PC region 71*c* provided in the logic circuit 221*c*.

Note that, in the configuration example of the imaging device 261*c* illustrated in FIG. 18, an example in which the guard ring 352 is also formed in the imaging element 220*c* has been illustrated, but since the guard ring 352 is not a region to be diced at the time of dicing on the first day, in other words, it is irrelevant to dicing when the logic circuit 221*b* is singulated and generated, it is also possible to adopt a configuration in which the guard ring is not provided.

In the above-described embodiment, the configuration in which the terminals are also formed in the 1PC region 71 (dicing region) and the terminals are connected to each other has been described, but the terminals may not be formed in the dicing region. By configuring the terminals and connecting the terminals to each other, it is possible to obtain an advantage that the logic circuit 221 and the imaging element 220 can be firmly connected.

As illustrated in FIG. 19, the 1PC region 71c including the element 311 and the guard ring 351 is located at a position D4 where dicing is performed, and is set as a dicing target region together with the wafer 101 when the wafer 101 is diced. As illustrated in FIG. 19, by performing dicing at the position D4, the wafer 101 is singulated into individual pieces, and the imaging device 261c as illustrated in FIG. 20 is generated.

The imaging device 261c according to the third embodiment has a configuration in which the element 311 and the guard ring 351 are included in the 1PC region 71c included in the logic circuit 221c before the wafer 101 is singulated into individual pieces, and dicing is performed including the element 311 and the guard ring 351.

Also in the imaging device 261c in the third embodiment, similarly to the imaging device 261a in the first embodiment, the logic circuit 221c is subjected to dicing twice at the time of manufacture. In a state after the second dicing is performed, that is, the imaging device 216c has a structure in which the end surfaces of the imaging element 220c and the logic circuit 221c are aligned, and a part of the silicon substrate or the wiring is exposed at the end surface.

In the imaging device 261c according to the third embodiment, similarly to the imaging device 261a according to the first embodiment, the logic circuit 221c is disposed at a position across the guard ring 232 in the imaging element 220c.

Also in the imaging device 261c according to the third embodiment, it is possible to prevent the size of the logic circuit 221c from increasing and to prevent the downsizing from being hindered. In addition, when the logic circuit 221c is transferred to the wafer 101, since the logic circuit 221c is transferred in a state where the 1PC region 71c is present in the logic circuit 221c, the logic circuit 221c can be evaluated after the transfer.

Imaging Device in Fourth Embodiment

Figure 21:
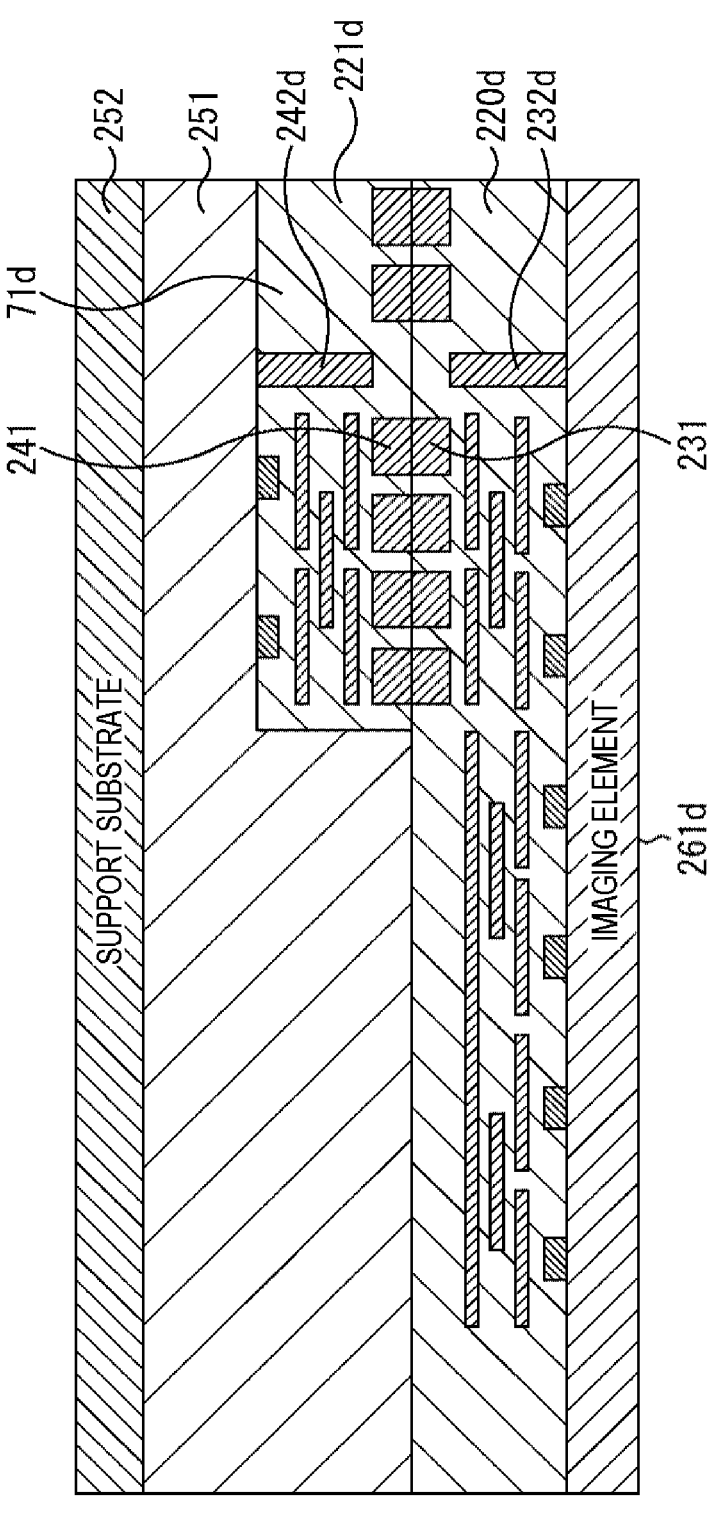
FIG. 21 is a diagram for explaining a configuration of an imaging device in a fourth embodiment.
Figure 22:
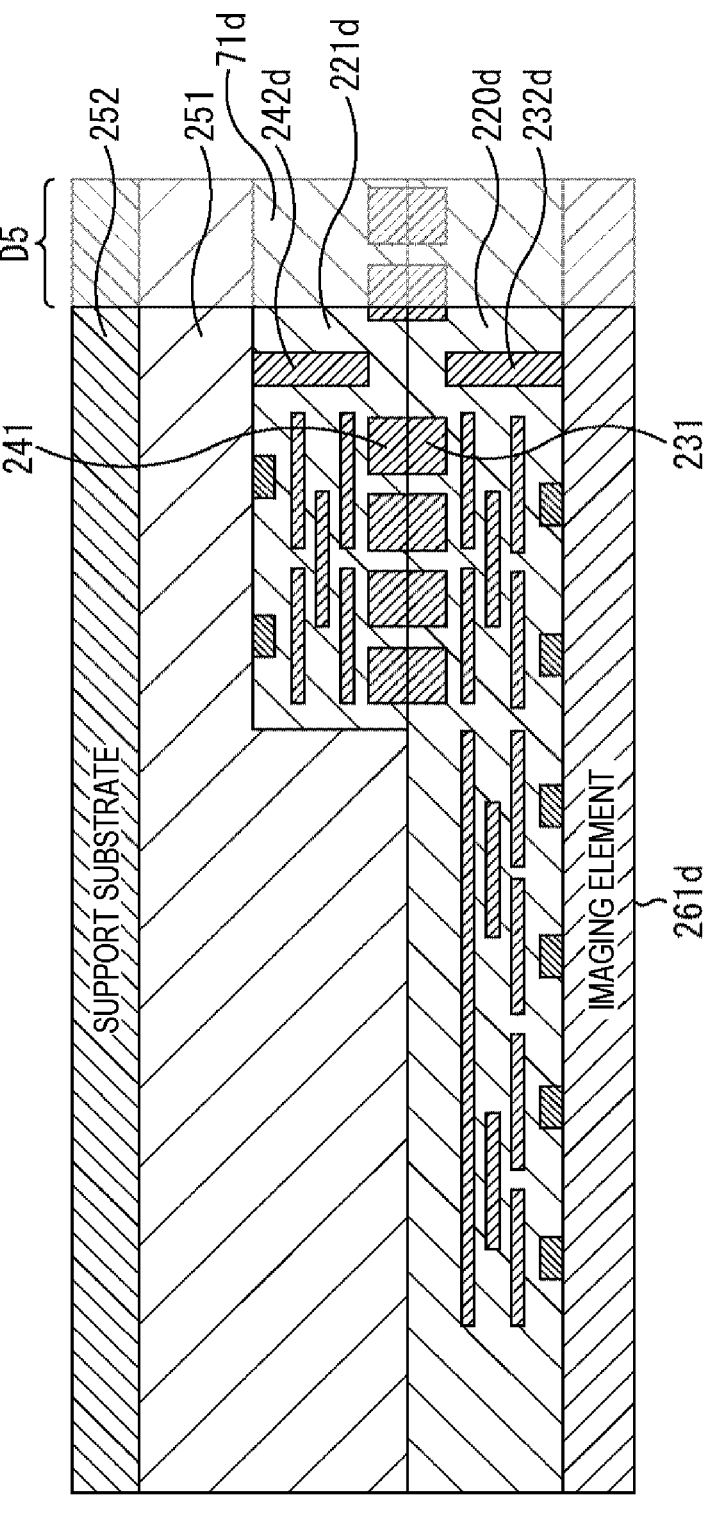
FIG. 22 is a diagram for explaining a configuration of the imaging device in the fourth embodiment.
Figure 23:
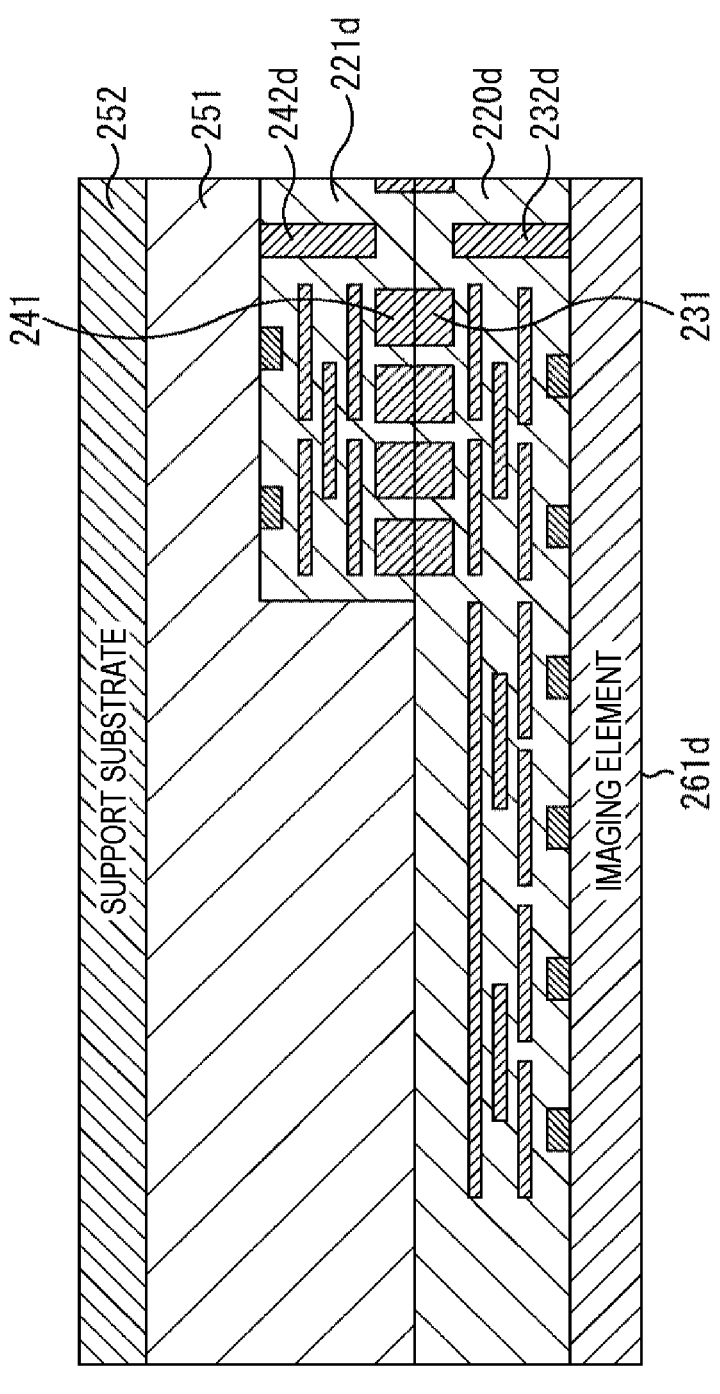
FIG. 23 is a diagram for explaining a configuration of the imaging device in the fourth embodiment.

A configuration and manufacturing of an imaging device 261d according to a fourth embodiment will be described with reference to FIGS. 21 to 23. In FIGS. 21 to 23, similar components to those of the imaging device 261a in the first embodiment are denoted by the same reference numerals, and the description thereof will be appropriately omitted.

FIG. 21 illustrates a state in which a logic circuit 221d is transferred to an imaging element 220d of the wafer 101, the oxide film 251 is formed, and the support substrate 252 is stacked.

A guard ring 242d of the logic circuit 221d of the imaging device 261d in the fourth embodiment is different in that it is formed to be shorter than the guard ring 242 (guard ring 242a) of the logic circuit 221a of the imaging device 261a in the first embodiment.

A guard ring 232d of the imaging element 220d of the imaging device 261d in the fourth embodiment is different in that it is formed to be shorter than the guard ring 232 (guard ring 232a) of the imaging element 220a of the imaging device 261a in the first embodiment.

The imaging device 261d according to the fourth embodiment is different from the first to third embodiments in that the guard ring 242d formed in the logic circuit 221d and the guard ring 232d formed in the imaging element 220d are not connected, in other words, the guard ring 242d and the guard ring 232d are arranged with a predetermined interval. Note that, also in the first to third embodiments, the guard ring 232 and a guard ring 234 may not be connected.

For example, in the case of a configuration in which the well of the logic circuit 221 and the well of the imaging element 220 have the same potential, the guard ring 232a and the guard ring 242a are connected as in the imaging device 261a of the first embodiment. On the other hand, in the case of a configuration in which the well of the logic circuit 221 and the well of the imaging element 220 have different potentials, the guard ring 232d and the guard ring 242d are not connected as in the imaging device 261d of the fourth embodiment.

The state of the imaging device 261d illustrated in FIG. 21 corresponds to the state of the imaging device 261a illustrated in FIG. 12. The logic circuit 221d is a logic circuit 221d determined as a non-defective product, and is in a state of being transferred onto an imaging element 220d of the wafer 101 in a state of including the 1PC region 71d.

As illustrated in FIG. 22, the 1PC region 71d is located at a position D5 where dicing is performed, and is set as a dicing target region together with the wafer 101 when the wafer 101 is diced. As illustrated in FIG. 22, by performing dicing at the position D5, the wafer 101 is singulated into individual pieces, and the imaging device 261d as illustrated in FIG. 23 is generated.

The imaging device 261d according to the fourth embodiment has a configuration in which the logic circuit 221d includes the 1PC region 71d before the wafer 101 is singulated into individual pieces, and dicing is performed including the 1PC region 71d.

Also in the imaging device 261d in the fourth embodiment, similarly to the imaging device 261a in the first embodiment, the logic circuit 221d is subjected to dicing twice at the time of manufacture. In a state after the second dicing is performed, that is, the imaging device 216d has a structure in which the end surfaces of the imaging element 220d and the logic circuit 221d are aligned, and a part of the silicon substrate or the wiring is exposed at the end surface.

In the imaging device 261d according to the fourth embodiment, similarly to the imaging device 261a according to the first embodiment, the logic circuit 221d is disposed at a position across the guard ring 232d in the imaging element 220d.

Also in the imaging device 261d according to the fourth embodiment, it is possible to prevent the size of the logic circuit 221d from increasing and to prevent the downsizing from being hindered. In addition, when the logic circuit 221d is transferred to the wafer 101, the logic circuit 221d is transferred in a state where the 1PC region 71d is present in the logic circuit 221d, so that the logic circuit 221d can be evaluated after the transfer.

Imaging Device in Fifth Embodiment

Figure 24:
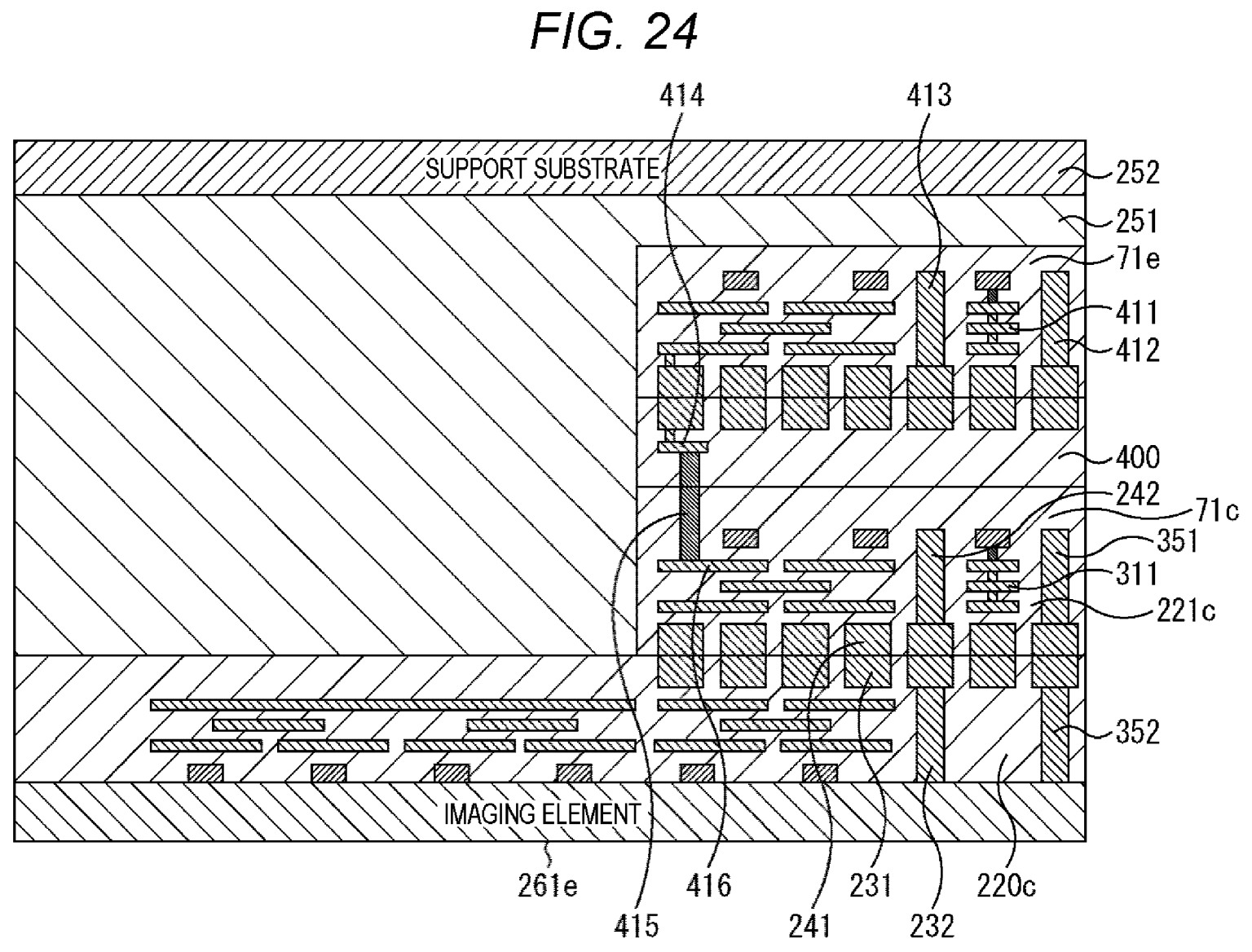
Figure 25:
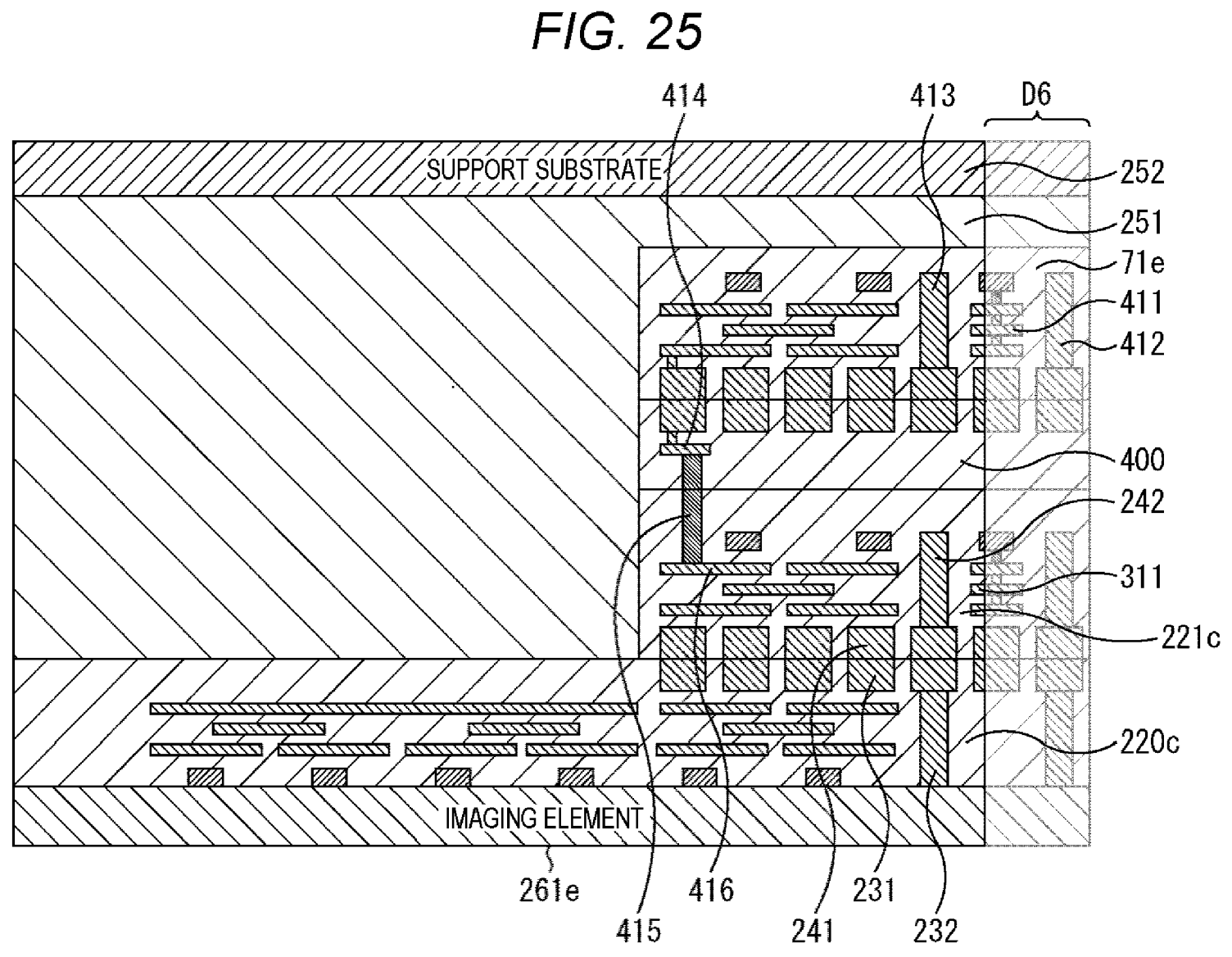
Figure 26:
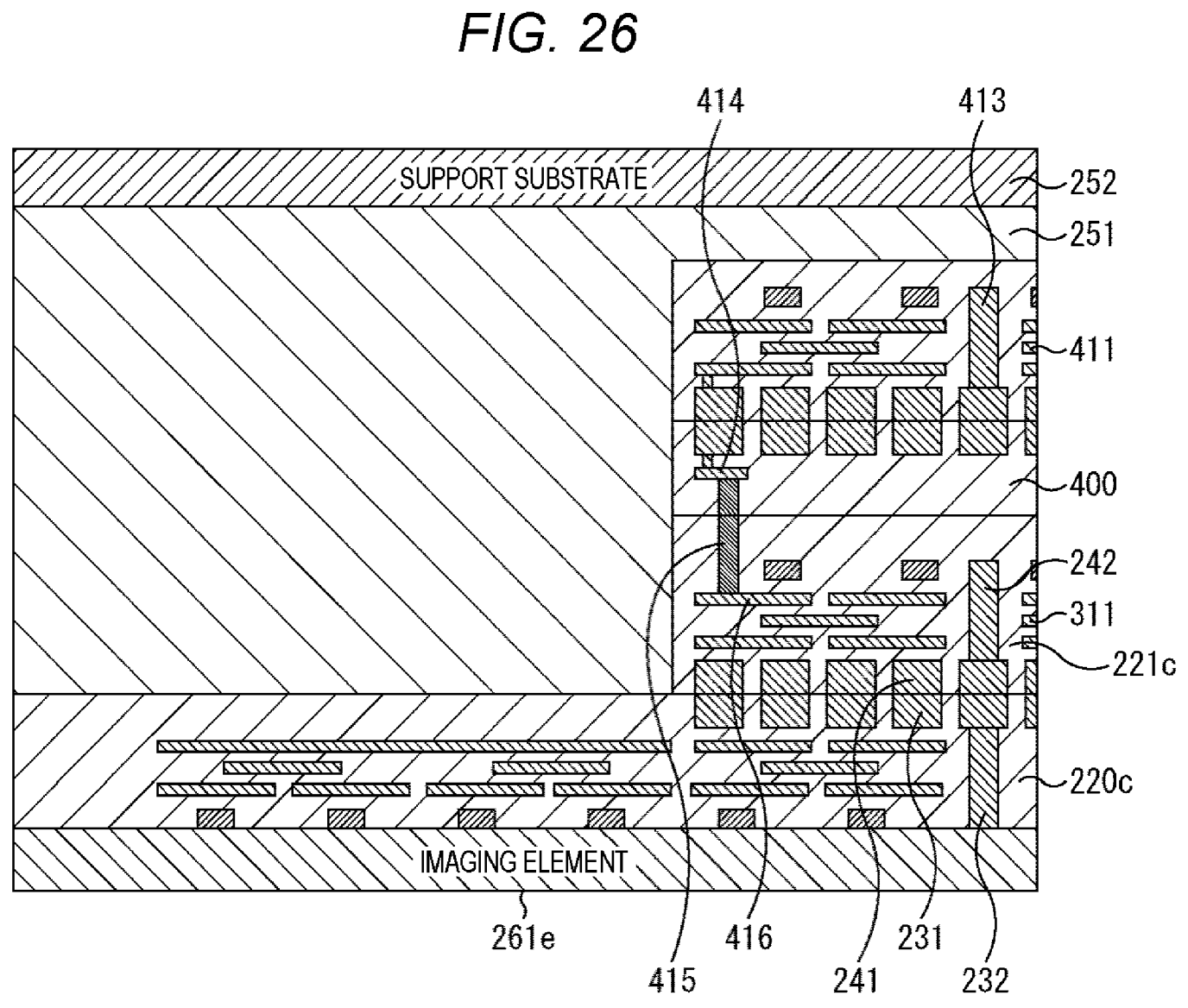

A configuration and manufacturing of an imaging device 261e according to a fifth embodiment will be described with reference to FIGS. 24 to 26. In FIGS. 24 to 26, similar components to those of the imaging device 261c in the third embodiment are denoted by the same reference numerals, and the description thereof will be appropriately omitted.

FIG. 24 illustrates a state in which the logic circuit 221c and a chip 400 are stacked in a wafer state, singulated, and then the singulated and stacked logic circuit 221c and chip 400 are transferred to the imaging element 220c of the wafer 101, the oxide film 251 is formed, and the support substrate 252 is stacked. The imaging device 261e according to the fifth embodiment is different from the imaging device 261c according to the third embodiment in that the chip 400 is further stacked, and the other points are similar.

The chip 400 can be, for example, a memory circuit 222. FIG. 24 illustrates a case where the logic circuit 221c is stacked on the imaging element 220c and the chip 400 (for example, the memory circuit 222) is stacked on the logic circuit 221c, but the chip 400 (for example, the memory circuit 222) may be stacked on the imaging element 220c and the logic circuit 221c may be stacked on the chip 400.

Similarly to the logic circuit 221c, the chip 400 includes a 1PC region 71e when transferred onto the logic circuit 221c. An element 411 is arranged in the 1PC region 71e of the chip 400 illustrated in FIG. 24. A guard ring 412 for protecting the element 411 from the influence of dicing at the time of dicing is also formed in the 1PC region 71e. A guard ring 413 is formed on the left side in the drawing of the element 411 in the 1PC region 71e of the chip 400.

A plurality of wirings 414 is also formed on the chip 400. At least one wiring 414 among the plurality of wirings 414 is connected to a wiring 416 in the logic circuit 221c via a wiring 415.

Here, the case where the 1PC region 71e included in the chip 400 has a similar configuration to the 1PC region 71c included in the logic circuit 221c has been described, but the 1PC region 71e and the 1PC region 71c may have different configurations.

As illustrated in FIG. 25, the 1PC region 71e including the element 411 and the guard ring 412 is located at a position D6 where dicing is performed, and is set as a dicing target region together with the wafer 101 when the wafer 101 is diced. As illustrated in FIG. 25, by performing dicing at the position D6, the wafer 101 is singulated into individual pieces, and the imaging device 261e as illustrated in FIG. 26 is generated.

The imaging device 261e according to the fifth embodiment has a configuration in which the element 311 and the guard ring 351 are included in the 1PC region 71c included in the logic circuit 221c before the wafer 101 is singulated into individual pieces, and when dicing is performed, dicing is performed including the element 311 and the guard ring 351.

The imaging device 261e according to the fifth embodiment has a configuration in which the element 411 and the guard ring 412 are included in the 1PC region 71e included in the chip 400 before the wafer 101 is singulated into individual pieces, and when dicing is performed, dicing is performed including the element 411 and the guard ring 412.

Also in the imaging device 261e in the fifth embodiment, similarly to the imaging device 261a in the first embodiment, the logic circuit 221e and the chip 400 are diced twice at the time of manufacture. In a state after the second dicing is performed, that is, the imaging device 216e has a structure in which the end surfaces of the imaging element 220c, the logic circuit 221c, and the chip 400 are aligned, and a part of the silicon substrate or the wiring is exposed at the end surface.

In the imaging device 261e according to the fifth embodiment, similarly to the imaging device 261a according to the first embodiment, the logic circuit 221c is disposed at a position across the guard ring 232 in the imaging element 220c. The chip 400 is also disposed at a position across the guard ring 232 in the imaging element 220c.

Also in the imaging device 261e according to the fifth embodiment, it is possible to prevent the sizes of the logic circuit 221c and the chip 400 from increasing and to prevent the downsizing from being hindered. In addition, when the logic circuit 221c and the chip 400 are transferred to the wafer 101, the logic circuit 221c and the chip 400 can be evaluated after the transfer because the logic circuit 221c is transferred in a state where the 1PC region 71c is present in the logic circuit 221c, and the chip 400 is transferred in a state where the 1PC region 71e is present in the chip 400.

Imaging Device in Sixth Embodiment

Figure 27:
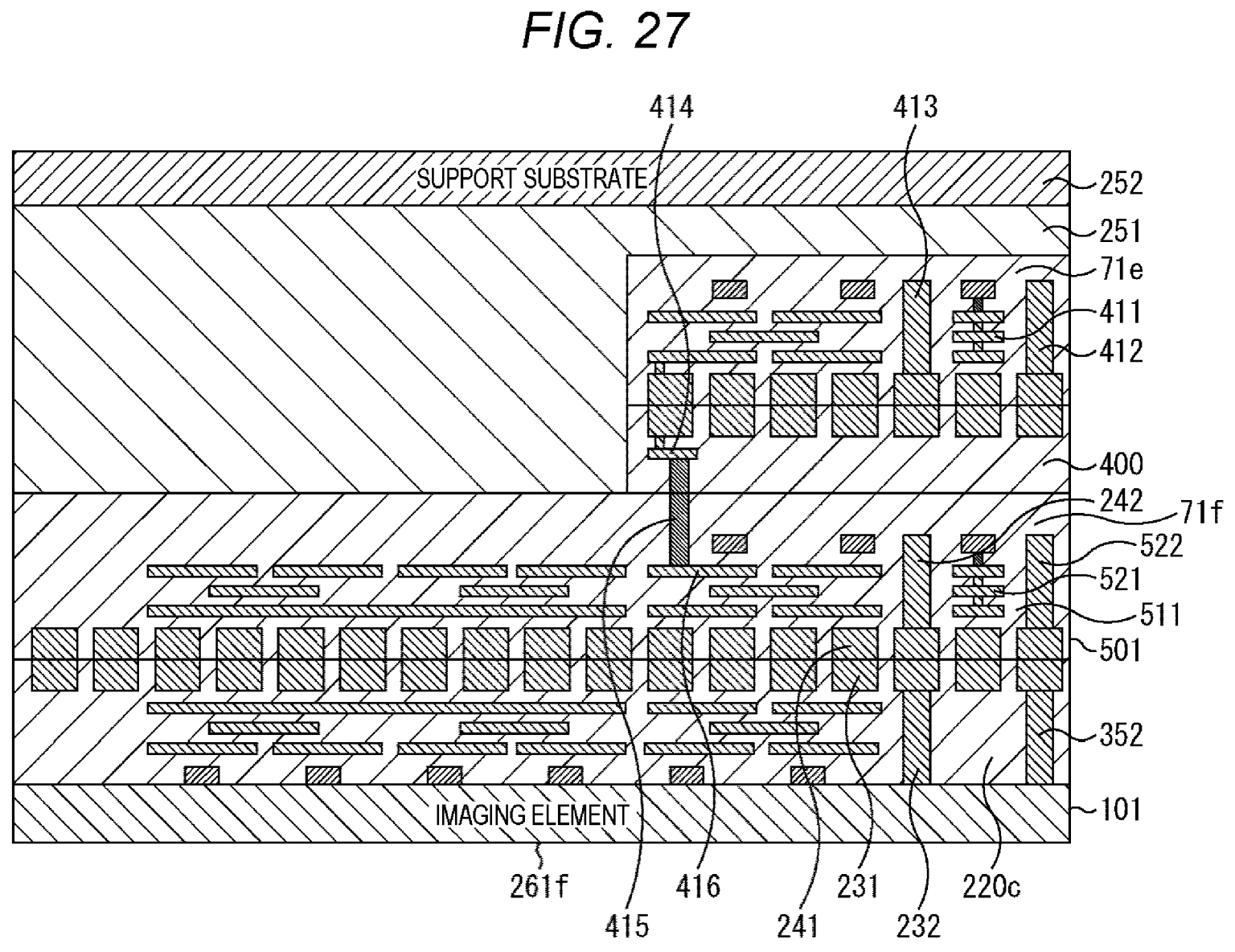
Figure 28:
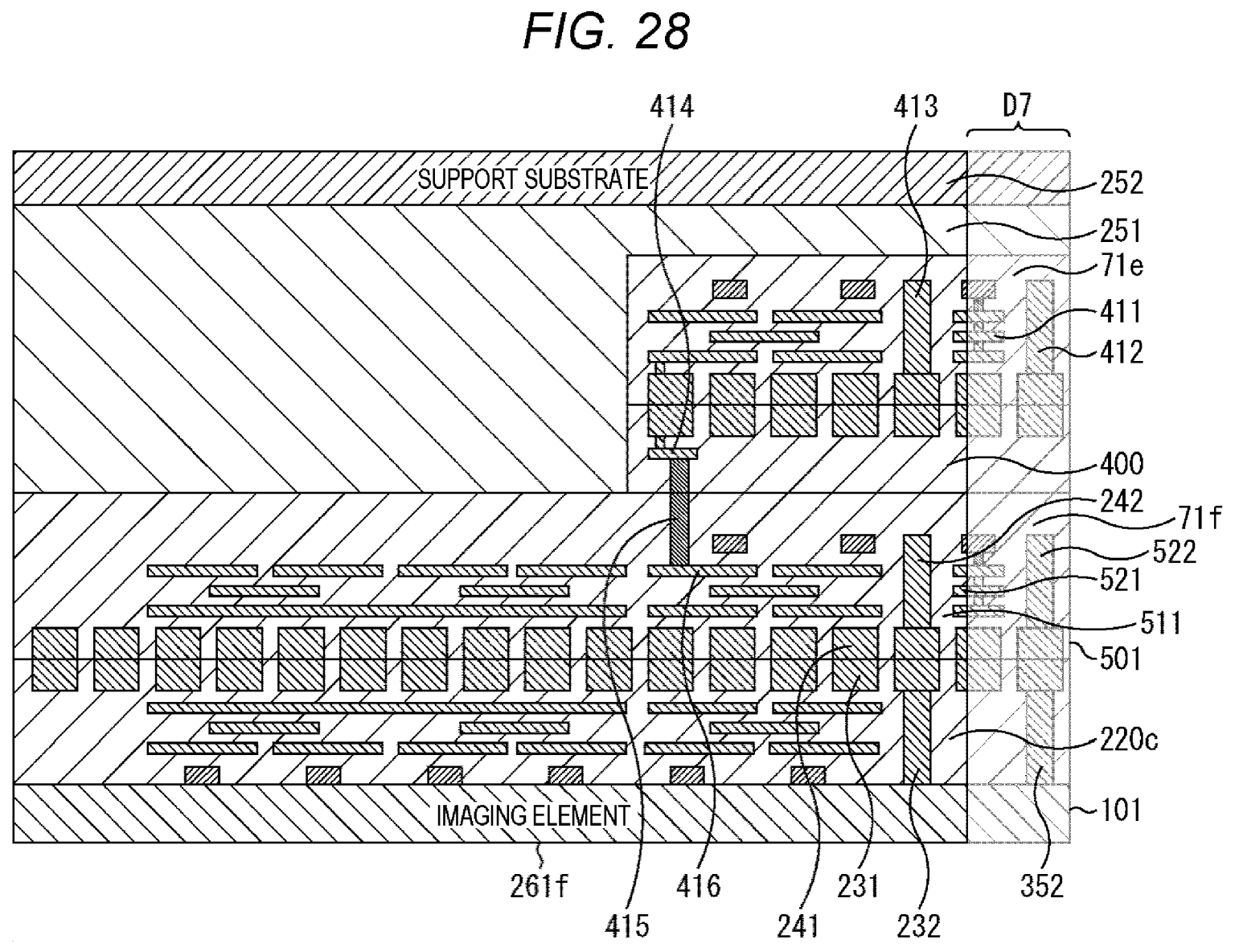
Figure 29:
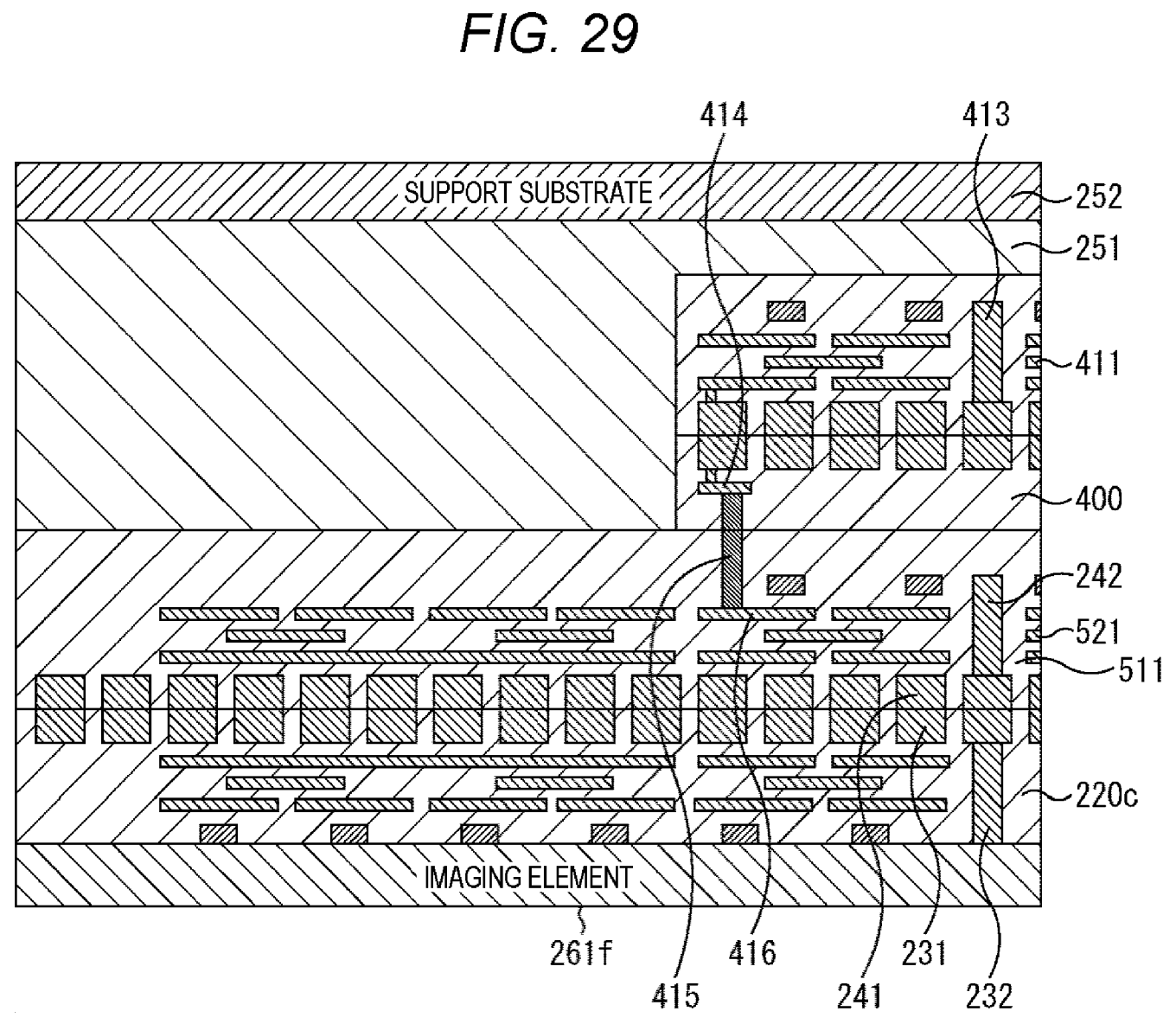

A configuration and manufacturing of an imaging device 261f according to a sixth embodiment will be described with reference to FIGS. 27 to 29. In FIGS. 27 to 29, similar components to those of the imaging device 261e in the fifth embodiment are denoted by the same reference numerals, and the description thereof will be appropriately omitted.

The imaging device 261f illustrated in FIG. 27 is different from the imaging device 261e illustrated in FIG. 24 in that the logic circuit 221c arranged in the second layer is stacked not as a chip but as a wafer, and the other points are similar.

In the imaging device 261f illustrated in FIG. 27, the imaging element 220c of the wafer 101 and a chip 511 of a wafer 501 are bonded by a wafer on wafer (WoW) technology. After the wafers are bonded to each other, the chip 400 is bonded onto the chip 511 by the CoW technology. The WoW technology is a technique of bonding and stacking wafers in a wafer state.

The chip 511 of the wafer 501 can be, for example, the logic circuit 221 or the memory circuit 222. The wafer 501 on which the plurality of chips 511 is formed and the imaging element 220c are bonded in a wafer state by the WoW technology to form a stacked structure. Thereafter, the chip 400 singulated from the wafer is transferred.

In this manner, the imaging device 261f can be manufactured using the WoW technology and the CoW technology.

The chip 511 includes a 1PC region 71f. The 1PC region 71f includes an element 521 and a guard ring 522. As illustrated in FIG. 28, the 1PC region 71f including the element 521 and the guard ring 522 is located at a position D7 where dicing is performed, and is set as a dicing target region together with the wafer 101 when the wafer 501 and the wafer 101 are diced.

The chip 400 is also transferred onto the wafer 501 in a state of including the 1PC region 71e, and the 1PC region 71e is transferred so as to be located at the position D7 where dicing is performed. When the wafer 101 and the wafer 501 are diced, the 1PC region 71e is also set as a dicing target region together with the wafer 101 and the wafer 501.

As illustrated in FIG. 28, by performing dicing at the position D7, the wafer in which the wafer 101 and the wafer 501 are stacked is singulated, and the imaging device 261f as illustrated in FIG. 29 is generated.

Since the imaging element 220f and the chip 511 of the imaging device 261f are diced after the wafer 101 and the wafer 501 are stacked, chips having the same size are stacked. The chip 400 is a small chip with respect to the imaging element 220f and the chip 511, and the imaging device 261f has a structure in which such a chip 400 is stacked.

The imaging device 261f is different from the imaging device 261 in other embodiments in that chips of the same size are stacked and a smaller chip are stacked.

The imaging device 261f in the sixth embodiment has a configuration in which the element 521 and the guard ring 522 are included in the 1PC region 71f included in the chip 511 of the wafer 501 before the wafer is singulated into individual pieces, and dicing is performed including the element 521 and the guard ring 522 at the time of dicing.

The imaging device 261f in the fifth embodiment has a configuration in which the element 411 and the guard ring 412 are included in the 1PC region 71d included in the chip

400 before the wafer is singulated into individual pieces, and dicing is performed including the element 411 and the guard ring 412 at the time of dicing.

In the imaging device 261*f* according to the sixth embodiment, similarly to the imaging device 261*a* according to the first embodiment, the chip 400 is subjected to dicing twice at the time of manufacture. In the state after the second dicing is performed, that is, in the state of the imaging device 216*f*, the end surfaces of the imaging element 220*c*, the chip 511, and the chip 400 are aligned, and a part of the silicon substrate or the wiring is exposed at the end surface.

In the imaging device 261*f* according to the sixth embodiment, similarly to the imaging device 261*a* according to the first embodiment, the chip 400 is disposed at a position across the guard ring 232 in the imaging element 220*e*. Since the chip 511 is stacked on the wafer 101 in the state of the wafer 501, the chip 511 is also disposed at a position across the guard ring 232 in the imaging element 220*c*.

Also in the imaging device 261*f* according to the sixth embodiment, it is possible to prevent the size of the chip 400 or the chip 511 from increasing and to prevent the downsizing from being hindered.

When the wafer 501 and the wafer 101 are stacked, since the wafer 501 is stacked in a state where the 1PC region 71*f* is present, the chip 511 formed on the wafer 501 can be evaluated even after the stacking.

Similarly, when the chip 400 is transferred to the wafer 501, since the chip 400 is transferred in a state where the 1PC region 71*e* is present in the chip, the chip 400 can be evaluated after the transfer.

Imaging Device in Seventh Embodiment

A configuration and manufacturing of an imaging device 261*g* according to a seventh embodiment will be described with reference to FIGS. 30 to 32. The imaging device 261*g* in the seventh embodiment is different from the other embodiments in that the logic circuit 221 and the imaging element 220 are connected by bumps.

Figure 30:
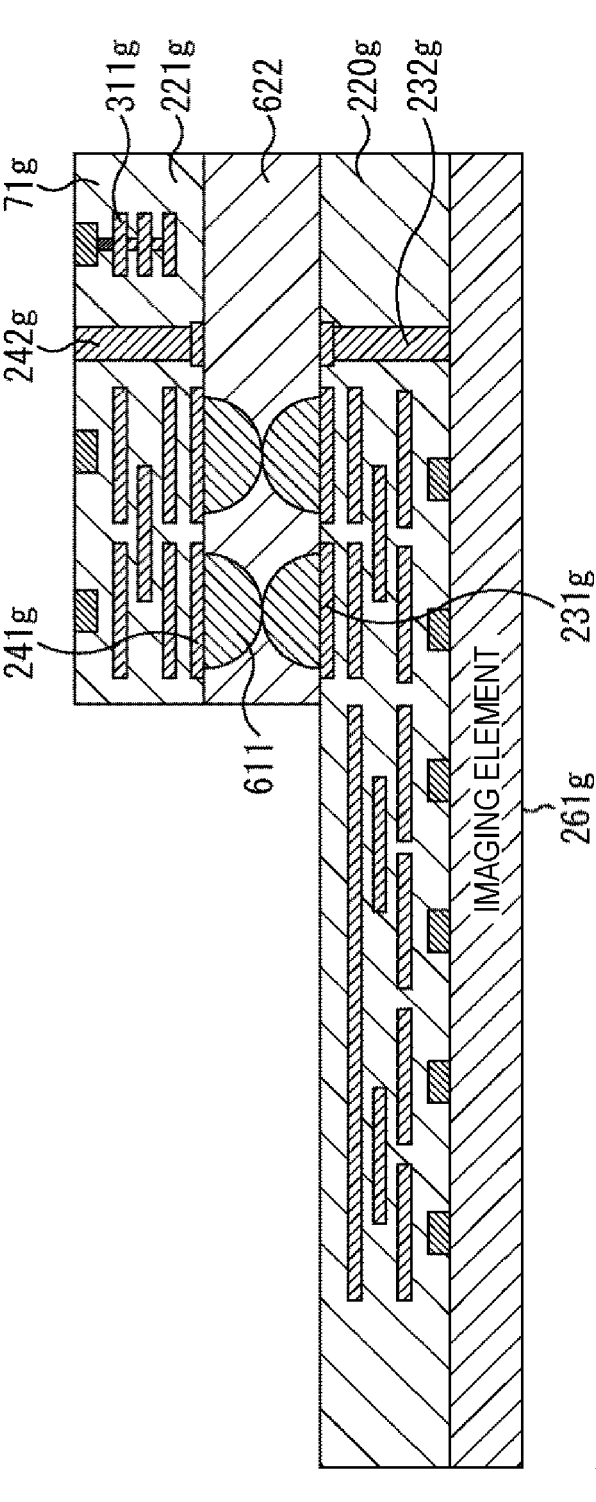
FIG. 30 is a diagram for explaining a configuration of an imaging device in a seventh embodiment.

The state illustrated in FIG. 30 illustrates a state in which a logic circuit 221*g* singulated from the wafer 102 is transferred to an imaging element 220*g* formed on the wafer 101. A terminal 231*g* is formed in the imaging element 220*g*, and a terminal 241*g* is formed in the logic circuit 221*g*. A bump 611 is formed on the terminal 231*g* and the terminal 241*g*, and the imaging element 220*g* and the logic circuit 221*g* are connected. A portion where the bump 611 is formed, in other words, a space (gap) between the imaging element 220*g* and the logic circuit 221*g* is filled with an underfill 622.

The logic circuit 221*g* is singulated from the wafer 102 in a state of including the 1PC region 71*g* and transferred onto the imaging element 220*g* of the wafer 101. In a 1PC region 71*g*, an element 311*g* is provided. As illustrated in FIG. 31, the 1PC region 71*g* including the element 311*g* is located at a position D8 where dicing is performed, and is a region to be diced together with the wafer 101 when the wafer 101 is diced. As illustrated in FIG. 31, by performing dicing at the position D8, the wafer 101 is singulated into individual pieces, and the imaging device 261*g* as illustrated in FIG. 32 is manufactured.

Figure 31:
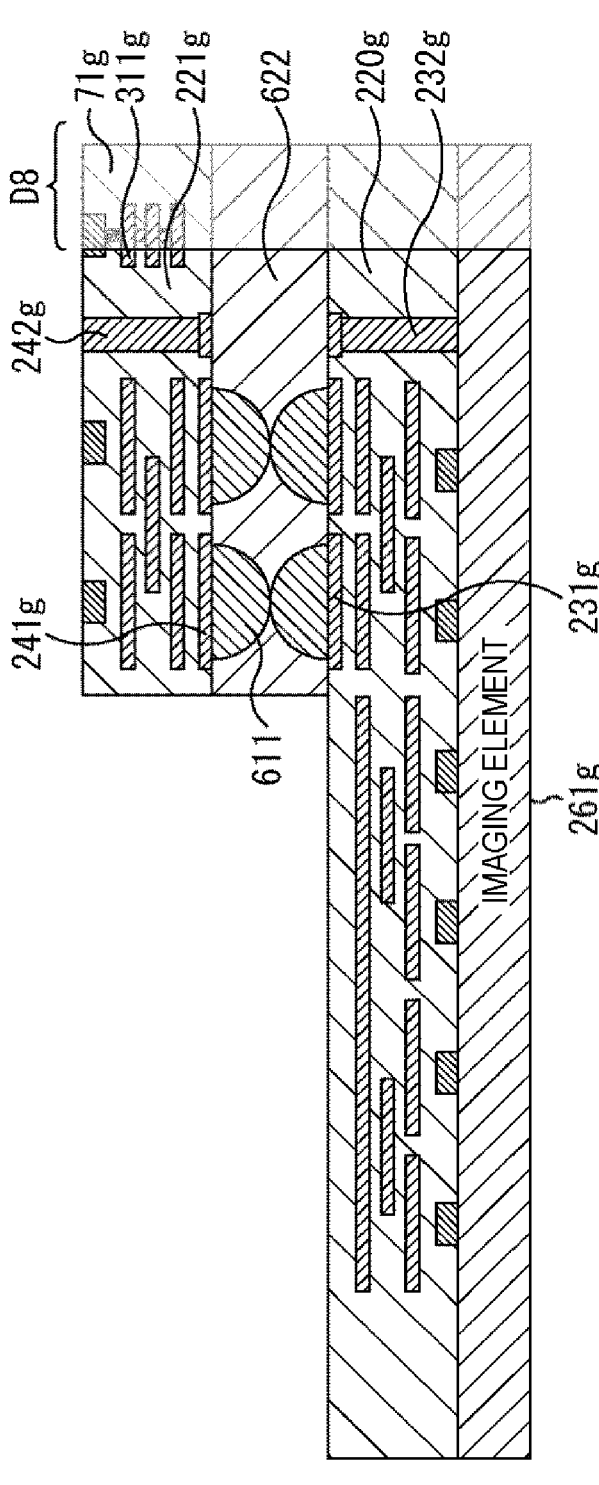
FIG. 31 is a diagram for explaining a configuration of the imaging device in the seventh embodiment.
Figure 32:
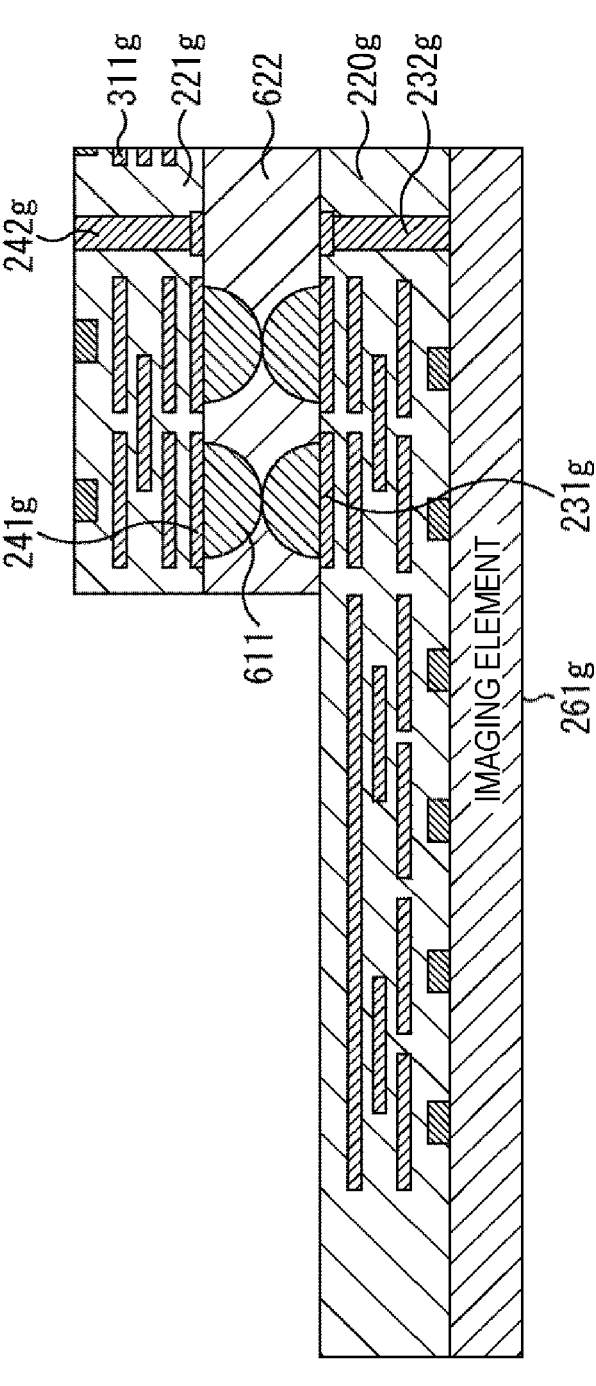
FIG. 32 is a diagram for explaining a configuration of the imaging device in the seventh embodiment.

The imaging device 261*g* illustrated in FIGS. 30 to 32 has a structure without the oxide film 251 and the support substrate 252. As described above, the imaging device 261*g* may have a structure without the oxide film 251 and the support substrate 252, or the imaging device 261*g* may have the oxide film 251 and the support substrate 252 although not illustrated.

In the imaging device 261*g* in the seventh embodiment, before the wafer 101 is singulated into individual pieces, the logic circuit 221*g* includes the 1PC region 71*g*, and the 1PC region 71*g* includes the element 311*g*, and when the wafer 101 is diced, the 1PC region 71*g* including the element 311*g* is also diced.

In the imaging device 261*g* in the seventh embodiment, similarly to the imaging device 261*a* in the first embodiment, the logic circuit 221*g* is subjected to dicing twice at the time of manufacture. In a state after the second dicing is performed, that is, the imaging device 216*g* has a configuration in which the end surfaces of the imaging element 220*g* and the logic circuit 221*g* are aligned, and a part of the silicon substrate or the wiring is exposed at the end surface.

In the imaging device 261*g* in the seventh embodiment, similarly to the imaging device 261*a* in the first embodiment, the logic circuit 221*g* is arranged at a position across a guard ring 232*g* in the imaging element 220*g*.

Also in the imaging device 261*g* in the seventh embodiment, it is possible to prevent the size of the logic circuit 221*g* from increasing and to prevent the downsizing from being hindered. In addition, when the logic circuit 221*g* is transferred to the wafer 101, since the logic circuit 221*g* is transferred in a state where the 1PC region 71*g* is present in the logic circuit 221*g*, the logic circuit 221*g* can be evaluated after the transfer.

Imaging Device in Eighth Embodiment

A configuration and manufacturing of an imaging device 261*h* according to an eighth embodiment will be described with reference to FIGS. 33 to 35.

In the first to seventh embodiments, an example in which the logic circuit 221 is transferred to the wafer 101 has been described. The eighth embodiment is different from the first to seventh embodiments in that the logic circuit 221 and the memory circuit 222 are transferred to the wafer 101. Similar parts to those of the imaging device 261*a* in the first embodiment are denoted by similar reference numerals, and the description thereof will be appropriately omitted.

Figure 33:
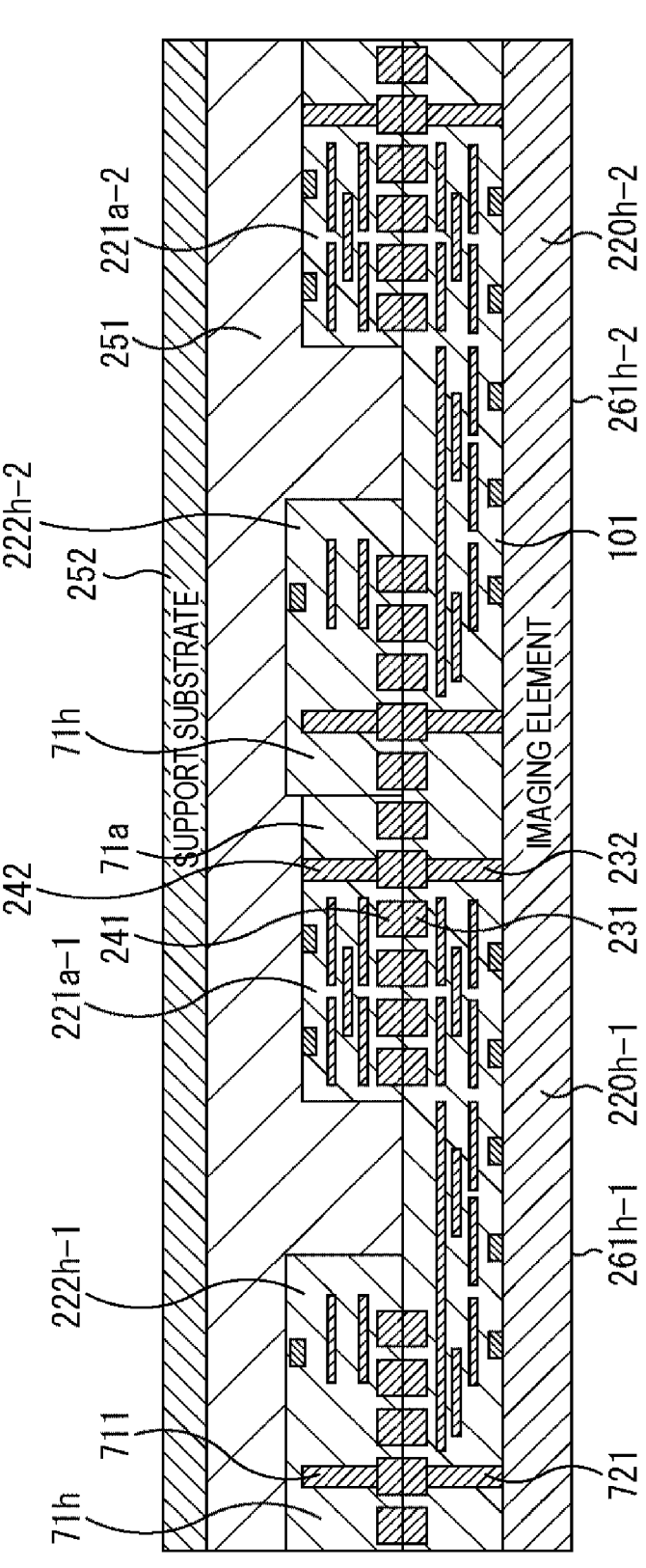
FIG. 33 is a diagram for explaining a configuration of an imaging device in an eighth embodiment.

As illustrated in FIG. 33, after the electrical inspection is performed, the logic circuit 221*a* confirmed to be a non-defective product is transferred to an imaging element 220*h* on the wafer 101. The logic circuit 221*a* to be transferred includes a 1PC region 71*a*. Similarly, after the electrical inspection is performed, a memory circuit 222*h* confirmed to be a non-defective product is transferred to the imaging element 220*h* on the wafer 101. The memory circuit 222*h* to be transferred includes a 1PC region 71*h*.

A guard ring 711 of the memory circuit 222*h* is provided to protect the elements in the memory circuit 222*h* when the memory circuit 222*h* is singulated from the wafer 103. In the example illustrated in FIG. 33, a guard ring 721 is formed in a position corresponding to the guard ring 711 of a memory circuit 222*g*, which is a region where the memory circuit 222*g* is transferred to the imaging element 220*g*.

When the logic circuit 221*a* and the memory circuit 222*h* are transferred to the wafer 101, a state illustrated in FIG. 33 is obtained. In FIG. 33, a logic circuit 221*a*-1 and a memory circuit 222*h*-1 are transferred onto an imaging element 261*h*-1 to be an imaging device 220*h*-1, and a logic circuit 221*a*-2 and a memory circuit 222*h*-2 are transferred onto an imaging element 261*h*-2 to be an imaging device 220*h*-2. In the following description, in a case where it is not necessary to distinguish the memory circuit 222*h*-1 and the memory circuit 222*h*-2 individually, they are simply described as the memory circuit 222*h*.

Figure 34:
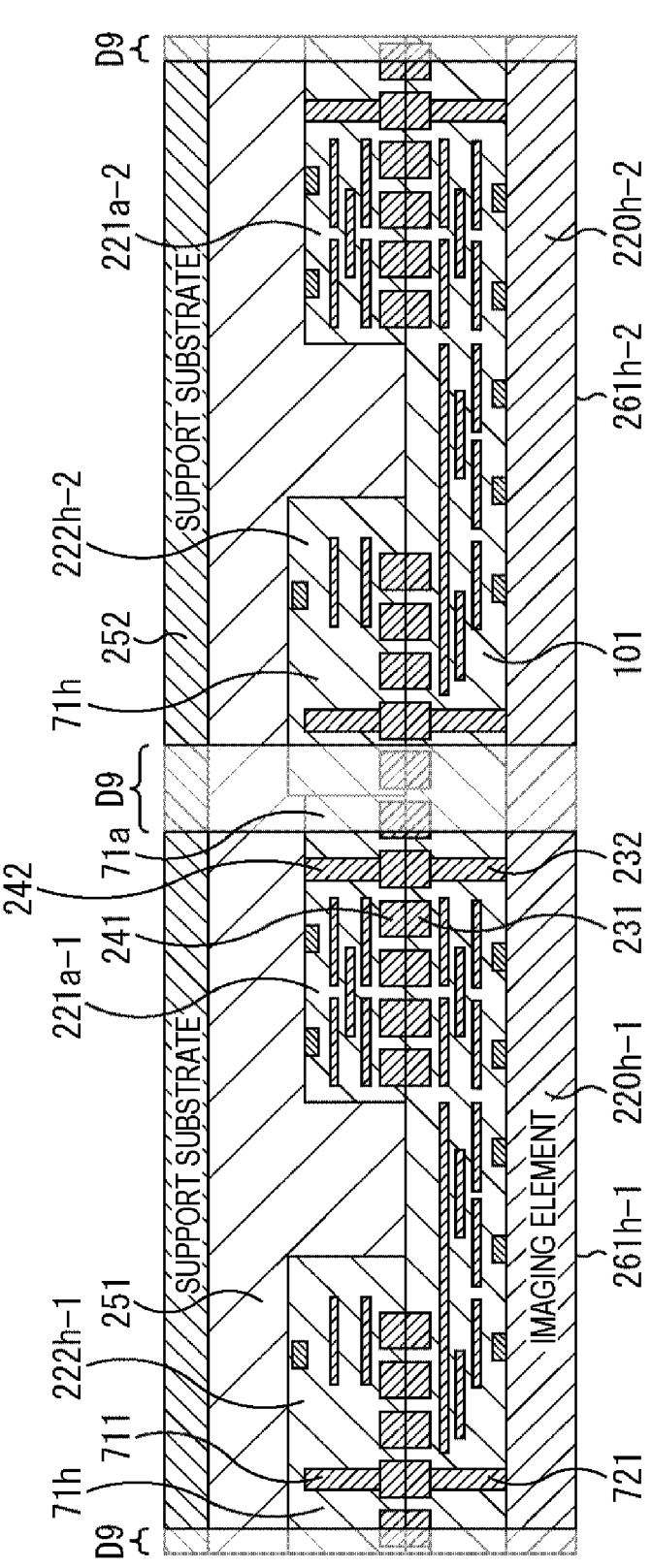
FIG. 34 is a diagram for explaining a configuration of the imaging device in the eighth embodiment.

As illustrated in FIG. 34, dicing is performed at a position D9 to singulate the imaging device 261*h*-1 and the imaging device 261*h*-2. By singulating, the imaging device 261*h* as illustrated in FIG. 35 is generated.

Since the 1PC region 71*a* and the 1PC region 71*h* are stacked on the wafer 101 at the dicing position D9, when the wafer 101 is diced, the 1PC region 71*a* of the stacked logic circuit 221*a* and the 1PC region 71*h* of the memory circuit 222*h* are also diced.

In the imaging device 261*h*, the logic circuit 221*a* and the memory circuit 222*h* are stacked on the imaging element 220*h*, a part of the logic circuit 221*a* and a part of the memory circuit 222*h* are included in the oxide film 51, and a part thereof is configured in a state in which the oxide film 51 is not provided.

Figure 35:
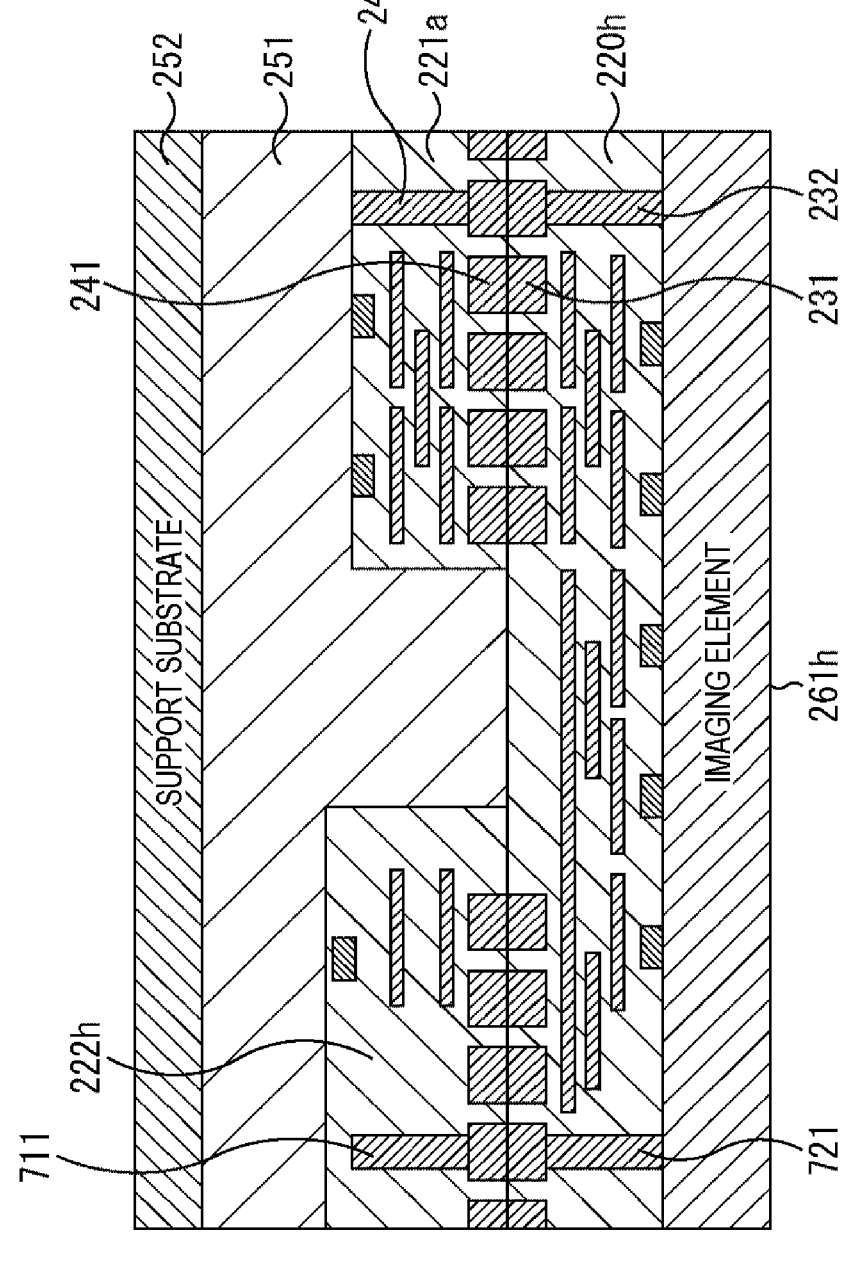
FIG. 35 is a diagram for explaining a configuration of the imaging device in the eighth embodiment.

An imaging device 261*h* illustrated in FIG. 35 has a structure in which the logic circuit 221*a* is stacked on the imaging element 220*h*. The end surfaces of the imaging element 220*h* and one surface (the surface on the right side in FIG. 35) of the logic circuit 221*a* are aligned by dicing, and the silicon substrate is exposed, for example.

The imaging device 261*h* illustrated in FIG. 35 has a structure in which the memory circuit 222*h* is also stacked on the imaging element 220*h*. The end surfaces of the imaging element 220*h* and one surface of the memory circuit 222*h* are aligned by dicing, and the silicon substrate is exposed, for example.

Among the side surfaces of the imaging device 261*h* illustrated in FIG. 35, at least two surfaces are a surface in which the end surfaces of the imaging element 220*h* and the logic circuit 221*a* are aligned, and a surface in which the end surfaces of the imaging element 220*h* and the memory circuit 221*h* are aligned, as described above.

Depending on the dicing method and the position, the wiring of the 1PC region 71*a* formed in the logic circuit 221*a* remains, or the wiring of the 1PC region 71*h* formed in the memory circuit 222*h* remains.

By forming the imaging device 261*h* as described above, the logic circuit 221*a* is arranged so as to straddle the guard ring 232 formed in the imaging element 220*h*, and the memory circuit 222*h* is arranged so as to straddle the guard ring 721 formed in the imaging element 220*h*.

Also in the imaging device 261*h* according to the eighth embodiment, it is possible to prevent the sizes of the logic circuit 221*a* and the memory circuit 222*h* from increasing and to prevent the downsizing from being hindered. In addition, when the logic circuit 221*a* is transferred to the wafer 101, the logic circuit 221*a* is transferred in a state in which the 1PC region 71*a* is present in the logic circuit 221*a*, so that the logic circuit 221*a* can be evaluated after the transfer. Similarly, when the memory circuit 221*h* is transferred to the wafer 101, the memory circuit 221*h* is transferred in a state where the 1PC region 71*h* is present in the memory circuit 221*h*, so that the memory circuit 222*h* can be evaluated after the transfer.

The first to eighth embodiments described above can be implemented in appropriate combination, and the combined embodiments are also within the scope of application of the present technology.

Application Example to Electronic Device

The imaging device described above can be applied to various electronic devices such as, for example, an imaging device such as a digital still camera and a digital video camera, a mobile phone with an imaging function, or other devices having an imaging function.

Figure 36:
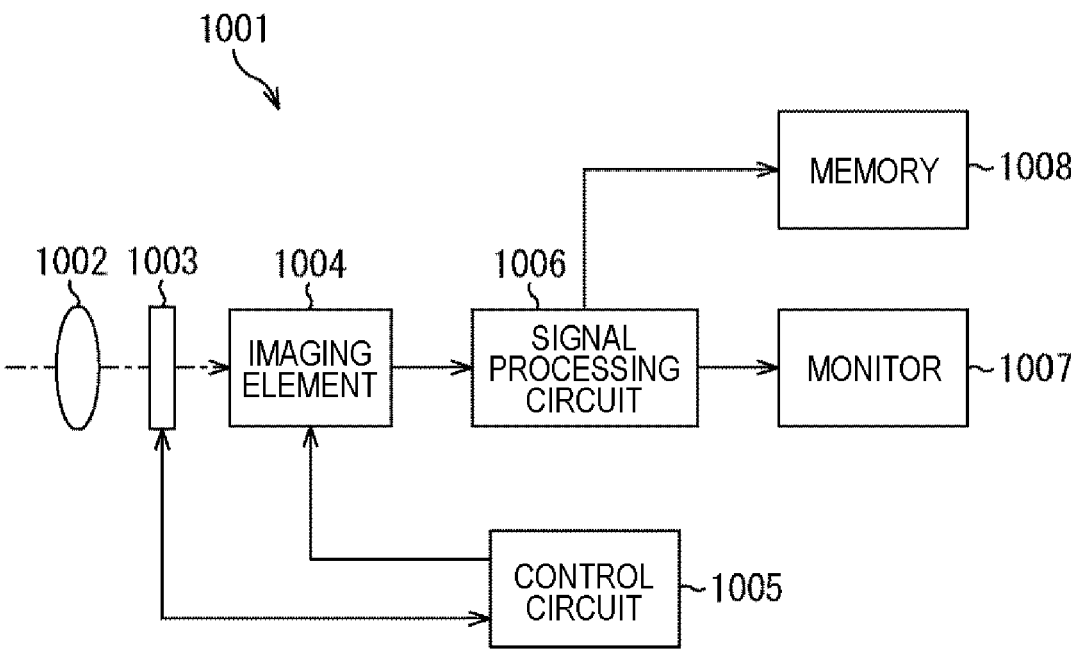
FIG. 36 is a diagram illustrating an example of an electronic device.

FIG. 36 is a block diagram illustrating a configuration example of the imaging device as the electronic device to which the present technology is applied. An imaging device 1001 illustrated in FIG. 36 includes an optical system 1002, a shutter device 1003, an imaging element 1004, a drive circuit 1005, a signal processing circuit 1006, a monitor 1007, and a memory 1008, and can capture still images and moving images.

The optical system 1002 has one or more lenses, and guides light (incident light) from a subject to the imaging element 1004 and forms as an image on a light receiving surface of the imaging element 1004.

The shutter device 1003 is arranged between the optical system 1002 and the imaging element 1004, and controls a light irradiation period and a shading period with respect to the imaging element 1004 in accordance with the control of the drive circuit 1005.

The imaging element 1004 includes a package including the above-described imaging element. The imaging element 1004 accumulates signal charges for a certain period of time in accordance with light formed as an image on the light receiving surface via the optical system 1002 and the shutter device 1003. The signal charges accumulated in the imaging element 1004 are transferred in accordance with a drive signal (a timing signal) supplied from the drive circuit 1005.

The drive circuit 1005 outputs a drive signal for controlling a transfer operation of the imaging element 1004 and a shutter operation of the shutter device 1003, to drive the imaging element 1004 and the shutter device 1003.

The signal processing circuit 1006 performs various kinds of signal processing on the signal charges outputted from the imaging element 1004. The image (image data) obtained by the signal processing applied by the signal processing circuit 1006 is supplied to the monitor 1007 to be displayed or supplied to the memory 1008 to be stored (recorded).

Also in the imaging device 1001 configured as described above, any of the imaging devices 261*a* to 261*h* described above can be applied to the optical system 1002 and the imaging element 1004.

Application Example to Endoscopic Surgery System

The technology according to an embodiment of the present disclosure (present technology) can be applied to various products. For example, the technology according to an embodiment of the present disclosure may be applied to an endoscopic surgery system.

Figure 37:
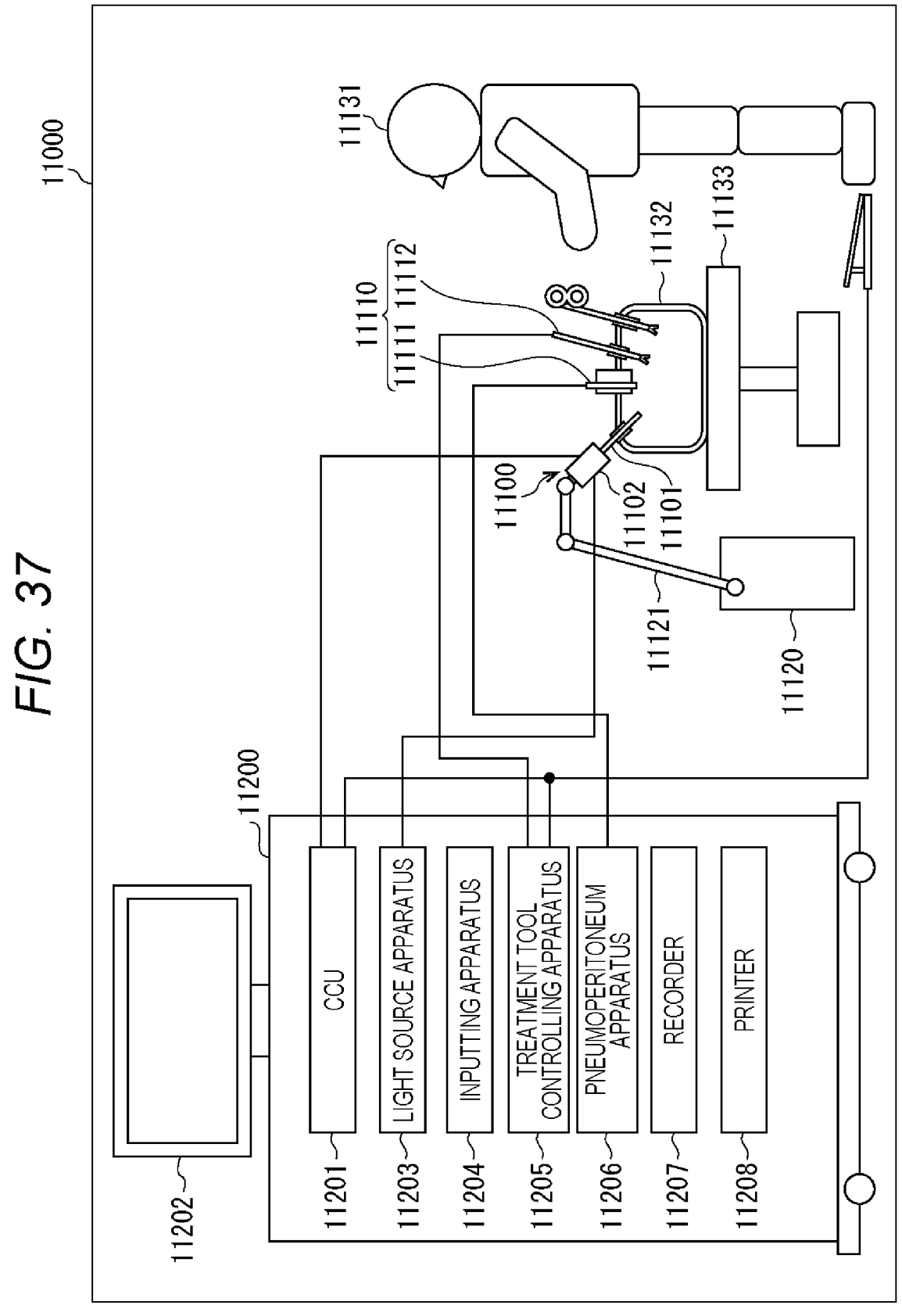
FIG. 37 is a view depicting an example of a schematic configuration of an endoscopic surgery system.

FIG. 37 is a view depicting an example of a schematic configuration of an endoscopic surgery system to which the technology according to an embodiment of the present disclosure (present technology) can be applied.

In FIG. 37, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a camera control unit (CCU) 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 38:
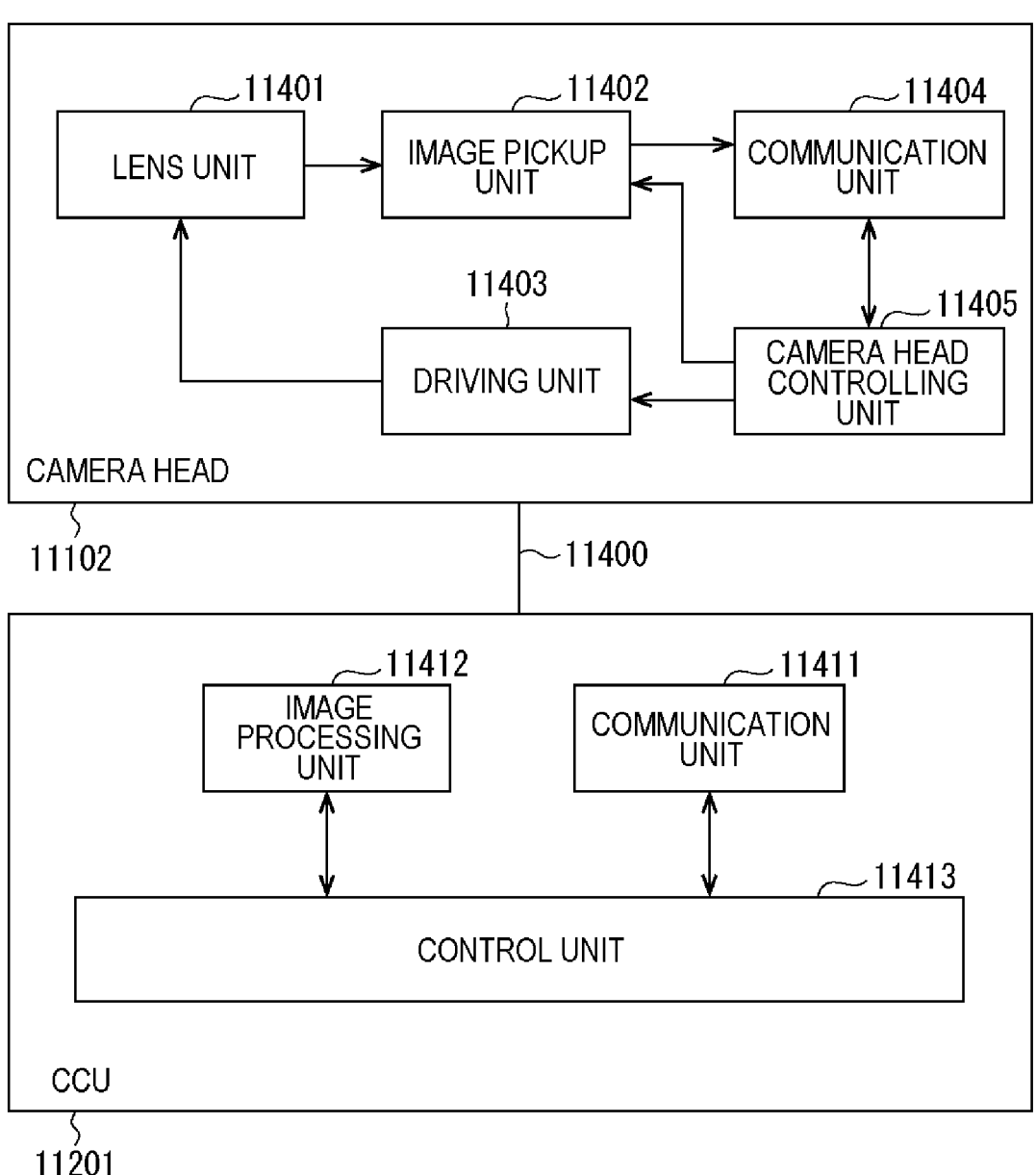
FIG. 38 is a block diagram depicting an example of a functional configuration of a camera head and a camera control unit (CCU).

FIG. 38 is a block diagram depicting an example of a functional configuration of the camera head 11102 and the CCU 11201 depicted in FIG. 37.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

Application Example to Mobile Body

The technology according to an embodiment of the present disclosure (present technology) can be applied to various products. For example, the technology according to the present disclosure may also be realized as a device mounted on any type of mobile body such as an automobile, an electric automobile, a hybrid electric automobile, a motorcycle, a bicycle, a personal mobility, an airplane, a drone, a ship, and a robot.

Figure 39:
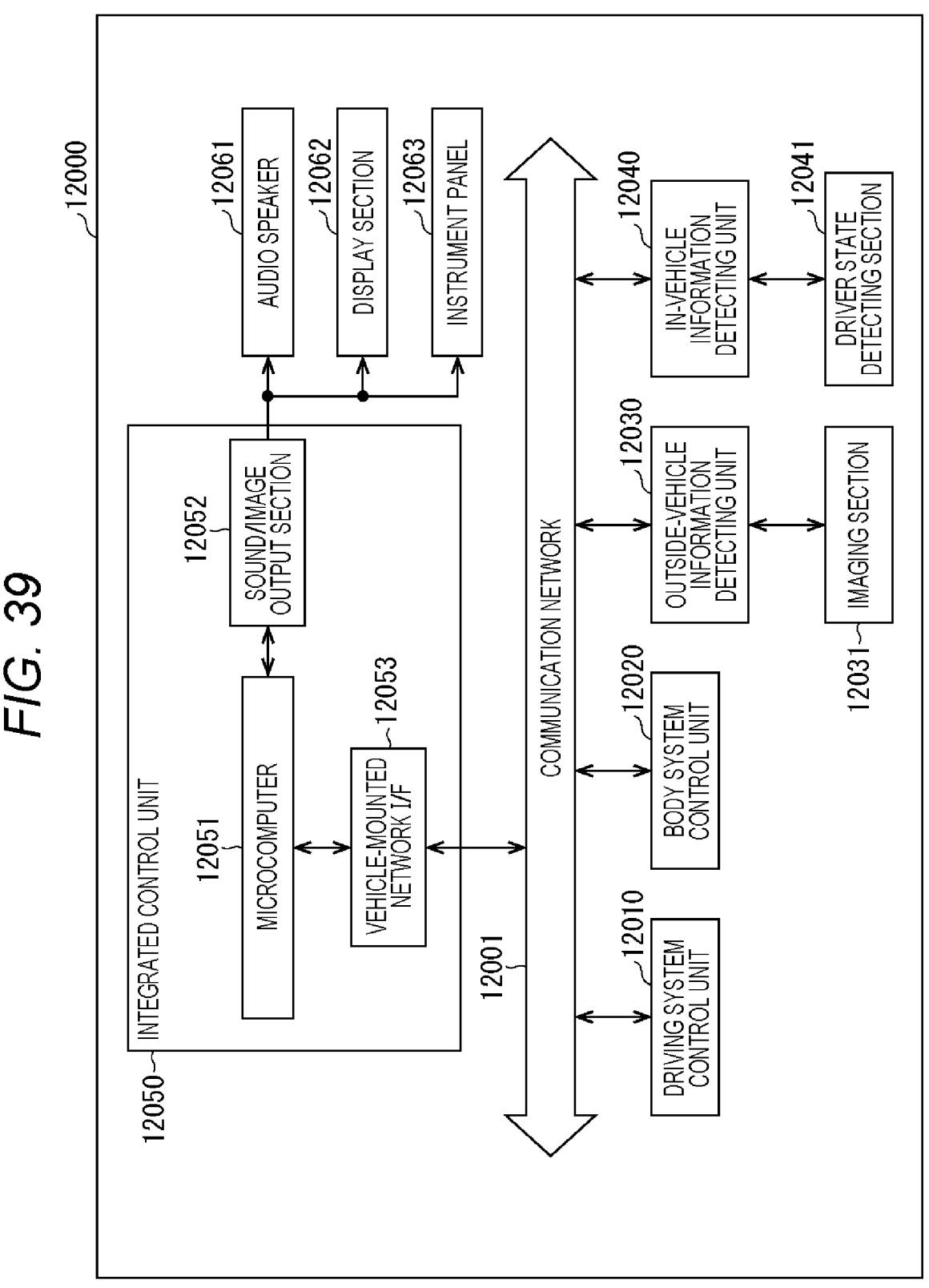
FIG. 39 is a block diagram depicting an example of schematic configuration of a vehicle control system.

FIG. 39 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 39, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 39, an audio speaker 12061, a display section 12062, and an instrument panel 12063 are illustrated as the output device. The display section 12062 may, for example, include at least one of an on-board display and a head-up display.

Figure 40:
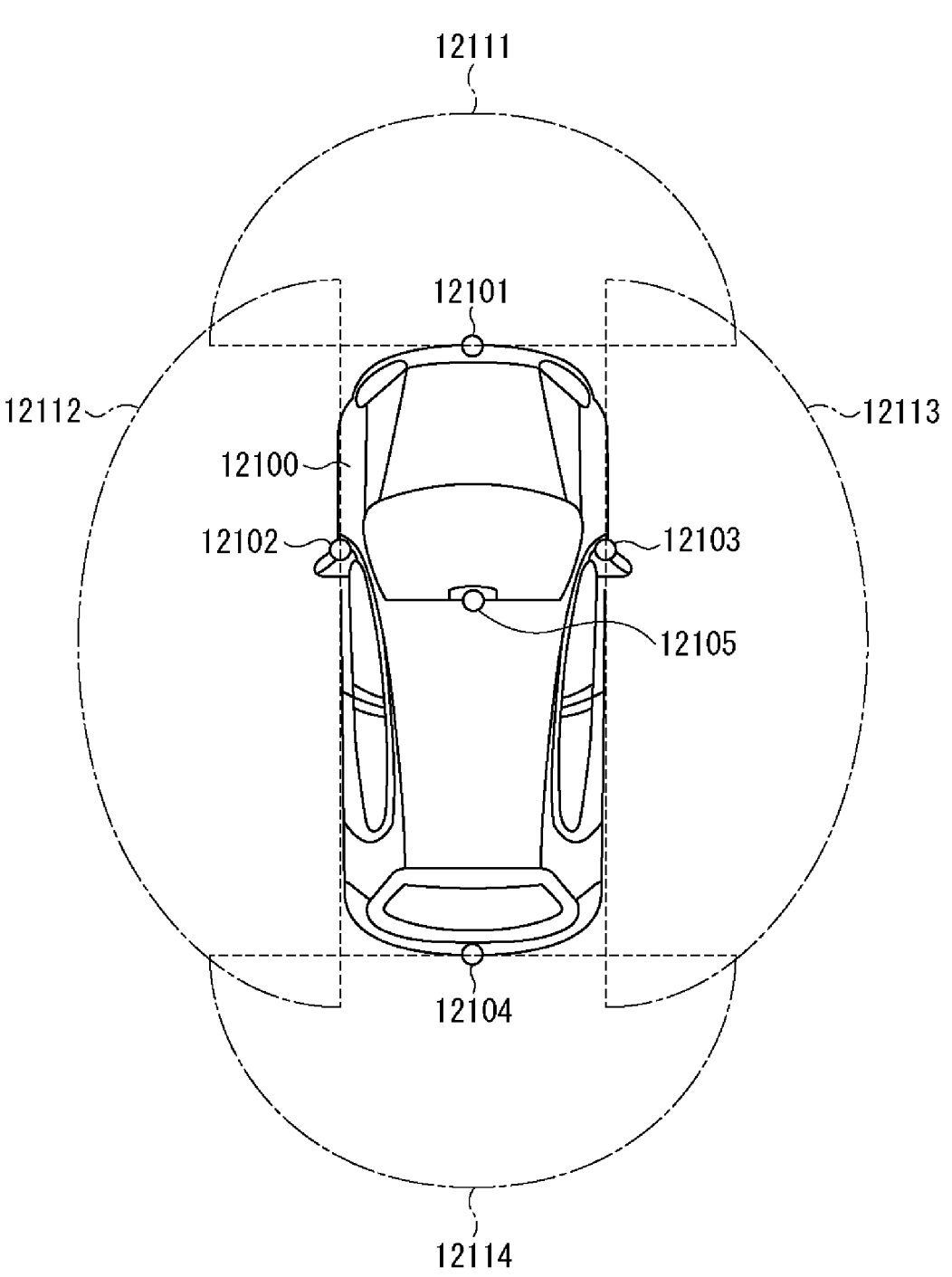
FIG. 40 is a diagram of assistance in explaining an example of installation positions of an outside-vehicle information detecting section and an imaging section.

FIG. 40 is a diagram depicting an example of the installation position of the imaging section 12031.

In FIG. 40, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 40 depicts an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object.

When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the present specification, the system represents the entire device including a plurality of devices.

Note that the effects described in the present specification are merely examples and are not limited, and other effects may be provided.

Note that the embodiments of the present technology are not limited to the above-described embodiments, and various modifications can be made without departing from the gist of the present technology.

Note that the present technology can also have the following configurations.

(1)

An imaging device including:

a first semiconductor chip; and a second semiconductor chip stacked on the first semiconductor chip, in which at least one surface of side surfaces of the first semiconductor chip and at least one surface of side surfaces of the second semiconductor chip are on a same plane.

(2)

The imaging device according to (1), in which the first semiconductor chip includes a first structure having a ring-shape, and the second semiconductor chip is disposed at a position straddling the first structure on the first semiconductor chip.

(3)

The imaging device according to (2), in which the second semiconductor chip includes a second structure having a ring-shape, and the first structure and the second structure are disposed at substantially a same position in a stacking direction.

(4)

The imaging device according to (3), in which the first structure and the second structure are guard rings.

(5)

The imaging device according to (3) or (4), in which the first structure and the second structure are connected.

(6)

The imaging device according to (3) or (4), in which the first structure and the second structure are arranged at a predetermined interval.

(7)

The imaging device according to any one of (1) to (6), in which the first semiconductor chip and the second semiconductor chip are connected by a bump.

(8)

The imaging device according to any one of (1) to (7), in which a third semiconductor chip is further stacked on the second semiconductor chip.

(9)

The imaging device according to any one of (1) to (7), in which a third semiconductor chip is further stacked on the first semiconductor chip.

(10)

The imaging device according to (8), in which the first semiconductor chip and the second semiconductor chip have substantially a same size, and the third semiconductor chip is smaller than the first semiconductor chip.

(11)

The imaging device according to any one of (1) to (10), in which the first semiconductor chip is a chip on which an imaging element is formed, and the second semiconductor chip is a chip on which a logic circuit or a memory circuit is formed.

(12)

The imaging device according to any one of (1) to (11), in which a first surface of the first semiconductor chip and a second surface of the second semiconductor chip on the same plane are end surfaces at a time of dicing.

(13)

The imaging device according to (12), in which the second surface is in a region for pellet check.

(14)

The imaging device according to (12), in which the second surface has a portion of an element that is in a region for pellet check.

(15)

An electronic device including:

an imaging device including:

a first semiconductor chip; and a second semiconductor chip stacked on the first semiconductor chip, at least one surface of side surfaces of the first semiconductor chip and at least one surface of side surfaces of the second semiconductor chip being on a same plane; and a processing unit that processes a signal from the imaging device.

(16)

A manufacturing method including:

transferring a second semiconductor chip to a wafer on which a first semiconductor chip is formed; and dicing the wafer in a state in which the second semiconductor chip is stacked, in which the second semiconductor chip in which a region for pellet check is formed is transferred to the wafer, and the region is also diced when diced with the wafer.

REFERENCE SIGNS LIST 101, 102, 103 Wafer
220 Imaging element
221 Logic circuit
231 Terminal
232 Guard ring
241 Terminal
242 Guard ring
251 Oxide film
252 Support substrate
261 Imaging device
311 Element
351, 352 Guard ring
400 Chip
411 Element
412, 413 Guard ring
414, 415, 416 Wiring
501 Wafer
511 Chip
521 Element
522 Guard ring
611 Bump
622 Underfill
711, 721 Guard ring

The invention claimed is:

1. An imaging device, comprising:

a first semiconductor chip; and a second semiconductor chip stacked on the first semiconductor chip, wherein at least one surface of side surfaces of the first semiconductor chip and at least one surface of side surfaces of the second semiconductor chip are on a same plane, the first semiconductor chip includes a first structure having a ring-shape, and the second semiconductor chip is at a position straddling the first structure on the first semiconductor chip.

2. The imaging device according to claim 1, wherein the second semiconductor chip includes a second structure having a ring-shape, and the first structure and the second structure are at substantially a same position in a stacking direction.

3. The imaging device according to claim 2, wherein the first structure and the second structure are guard rings.

4. The imaging device according to claim 2, wherein the first structure and the second structure are connected.

5. The imaging device according to claim 2, wherein the first structure and the second structure are arranged at a predetermined interval.

6. The imaging device according to claim 1, wherein the first semiconductor chip and the second semiconductor chip are connected by a bump.

7. The imaging device according to claim 1, further comprising a third semiconductor chip stacked on the second semiconductor chip.

8. The imaging device according to claim 1, further comprising a third semiconductor chip stacked on the first semiconductor chip.

9. The imaging device according to claim 7, wherein the first semiconductor chip and the second semiconductor chip have substantially a same size, and the third semiconductor chip is smaller than the first semiconductor chip.

10. The imaging device according to claim 1, wherein the first semiconductor chip is a chip on which an imaging element is formed, and the second semiconductor chip is a chip on which a logic circuit or a memory circuit is formed.

11. The imaging device according to claim 1, wherein a first surface of the first semiconductor chip and a second surface of the second semiconductor chip on the same plane are end surfaces at a time of dicing.

12. The imaging device according to claim 11, wherein the second surface is in a region for pellet check.

13. The imaging device according to claim 11, wherein the second surface has a portion of an element that is in a region for pellet check.

14. An electronic device, comprising:

an imaging device including:

a first semiconductor chip; and a second semiconductor chip stacked on the first semiconductor chip, wherein at least one surface of side surfaces of the first semiconductor chip and at least one surface of side surfaces of the second semiconductor chip being on a same plane, the first semiconductor chip includes a first structure having a ring-shape, and the second semiconductor chip is at a position straddling the first structure on the first semiconductor chip; and a processing unit configured to process a signal from the imaging device.

15. A manufacturing method, comprising:

transferring a second semiconductor chip to a wafer on which a first semiconductor chip is formed; and dicing the wafer in a state in which the second semiconductor chip is stacked, wherein the second semiconductor chip in which a region for pellet check is formed is transferred to the wafer, the region is also diced when diced with the wafer, the first semiconductor chip includes a first structure having a ring-shape, and the second semiconductor chip is at a position straddling the first structure on the first semiconductor chip.

* * * * *